US012575241B2

(12) United States Patent
Xi et al.

(10) Patent No.: US 12,575,241 B2
(45) Date of Patent: Mar. 10, 2026

(54) LIGHT-EMITTING ELEMENT ENCAPSULATION STRUCTURE, DISPLAY PANEL, DISPLAY DEVICE, AND MANUFACTURING METHODS

(71) Applicant: TIANMA ADVANCED DISPLAY TECHNOLOGY INSTITUTE (XIAMEN) CO., LTD., Xiamen (CN)

(72) Inventors: Kerui Xi, Xiamen (CN); Zhenyu Jia, Xiamen (CN); Jiansheng Zhong, Xiamen (CN)

(73) Assignee: TIANMA ADVANCED DISPLAY TECHNOLOGY INSTITUTE (XIAMEN) CO., LTD., Xiamen (CN)

( * ) Notice: Subject to any disclaimer, the term of this patent is extended or adjusted under 35 U.S.C. 154(b) by 373 days.

(21) Appl. No.: 18/325,001

(22) Filed: May 29, 2023

(65) Prior Publication Data

US 2023/0307600 A1 Sep. 28, 2023

(30) Foreign Application Priority Data

Dec. 30, 2022 (CN) .......................... 202211733524.2

(51) Int. Cl.
H10H 20/857 (2025.01)
H10H 20/01 (2025.01)
(Continued)

(52) U.S. Cl.
CPC .......... H10H 20/857 (2025.01); H10H 20/01 (2025.01); H10H 20/813 (2025.01); H10H 20/854 (2025.01)

(58) Field of Classification Search
CPC .... H10H 20/854; H10H 20/01; H10H 20/813;

H10H 20/857; H10H 20/8312; H10H 20/018; H10H 20/8512; H10H 29/142; H10H 20/8513; H10H 20/856; H10H 20/841; H10H 20/84; H10H 20/835; H10H 20/8316; H10H 20/851; H01L 25/0753; H01L 25/167; H10K 59/122; H10K 59/35; H10K 59/1213; H10K 50/84;
(Continued)

(56) References Cited

U.S. PATENT DOCUMENTS

| | | | |
|---|---|---|---|
| 2011/0193056 A1* | 8/2011 | Wang ................... | H10H 20/814 |
| | | | 257/E33.056 |
| 2014/0186979 A1* | 7/2014 | Tu ........................ | H10H 20/852 |
| | | | 438/27 |

(Continued)

FOREIGN PATENT DOCUMENTS

| | | |
|---|---|---|
| CN | 113555491 A | 10/2021 |
| CN | 114975743 A | 8/2022 |

*Primary Examiner* — Mouloucoulaye Inoussa
(74) *Attorney, Agent, or Firm* — KILPATRICK TOWNSEND & STOCKTON LLP

(57) ABSTRACT

A light-emitting element encapsulation structure, a display panel, a display device, a method for manufacturing a light-emitting element encapsulation structure, and a method for manufacturing a display panel are provided. The light-emitting element encapsulation structure includes an encapsulation layer and at least two light-emitting elements. The at least two light-emitting elements are embedded in the encapsulation layer. In performing the transfer process, the light-emitting element encapsulation structure may be transferred as a whole.

20 Claims, 14 Drawing Sheets

(51) Int. Cl.
    *H10H 20/813*       (2025.01)
    *H10H 20/854*       (2025.01)

(58) Field of Classification Search
    CPC .... H10K 50/805; H10K 59/805; H10K 59/87;
           H10K 2102/311; G09G 2300/0809; G09G
               2300/0842; G09G 2300/0426; G09G
               2320/0271; G09G 2330/028; H05K
                          2201/10128
    See application file for complete search history.

(56)           References Cited

U.S. PATENT DOCUMENTS

| | | | | |
|---|---|---|---|---|
| 2015/0255505 | A1* | 9/2015 | Jeoung | H10H 20/8514 257/89 |
| 2016/0190380 | A1* | 6/2016 | Luan | H10F 77/93 257/82 |
| 2016/0351767 | A1* | 12/2016 | Choi | H01L 25/167 |
| 2017/0092820 | A1* | 3/2017 | Kim | H10H 20/825 |
| 2017/0207249 | A1* | 7/2017 | Rhee | H01L 25/167 |
| 2017/0250316 | A1* | 8/2017 | Yeon | H10H 20/8513 |
| 2017/0294479 | A1* | 10/2017 | Cha | H10H 20/01 |
| 2018/0053882 | A1* | 2/2018 | Cheng | H10H 20/856 |
| 2018/0122786 | A1* | 5/2018 | Wu | H01L 24/29 |
| 2018/0308420 | A1* | 10/2018 | Shin | H04N 25/76 |
| 2019/0288049 | A1* | 9/2019 | Takeya | H01L 25/167 |
| 2020/0075564 | A1* | 3/2020 | Lin | H01L 24/24 |
| 2021/0118856 | A1* | 4/2021 | Wu | H10H 20/819 |
| 2021/0229098 | A1* | 7/2021 | Boehm | B01L 3/502753 |
| 2021/0317958 | A1* | 10/2021 | Kageyama | F21V 29/503 |
| 2021/0366981 | A1* | 11/2021 | Yeon | H10K 59/122 |
| 2021/0375833 | A1* | 12/2021 | Lee | H10H 20/857 |
| 2022/0005984 | A1* | 1/2022 | Liao | H10H 20/8512 |
| 2022/0189933 | A1* | 6/2022 | Zhang | H10H 20/8515 |
| 2022/0293573 | A1* | 9/2022 | Ishii | H01L 24/97 |
| 2022/0352442 | A1* | 11/2022 | Yeo | H10H 29/142 |
| 2022/0415989 | A1* | 12/2022 | Takeya | H01L 25/167 |
| 2023/0037888 | A1* | 2/2023 | Yeon | H10H 20/835 |
| 2023/0049635 | A1* | 2/2023 | Choi | H10H 29/142 |
| 2023/0131636 | A1* | 4/2023 | Kuo | H10H 20/856 257/88 |
| 2023/0163111 | A1* | 5/2023 | Yen | H01L 25/167 257/91 |
| 2023/0215856 | A1* | 7/2023 | Kim | H10H 20/8513 257/91 |
| 2023/0282631 | A1* | 9/2023 | Jeong | H01L 24/16 257/91 |
| 2023/0335689 | A1* | 10/2023 | Kim | H10D 86/00 |
| 2023/0335697 | A1* | 10/2023 | Hashimoto | H01L 25/0753 |
| 2023/0369271 | A1* | 11/2023 | Hashimoto | H10D 86/451 |

* cited by examiner

| | |
|---|---|
| Obtain a first temporary substrate | —S110 |
| Arrange at least two light-emitting elements on one side of the first temporary substrate | —S120 |
| Form an encapsulation layer, where the encapsulation layer at least fills around the light-emitting elements | —S130 |
| Peel off the first temporary substrate to obtain the light-emitting element encapsulation structure | —S140 |

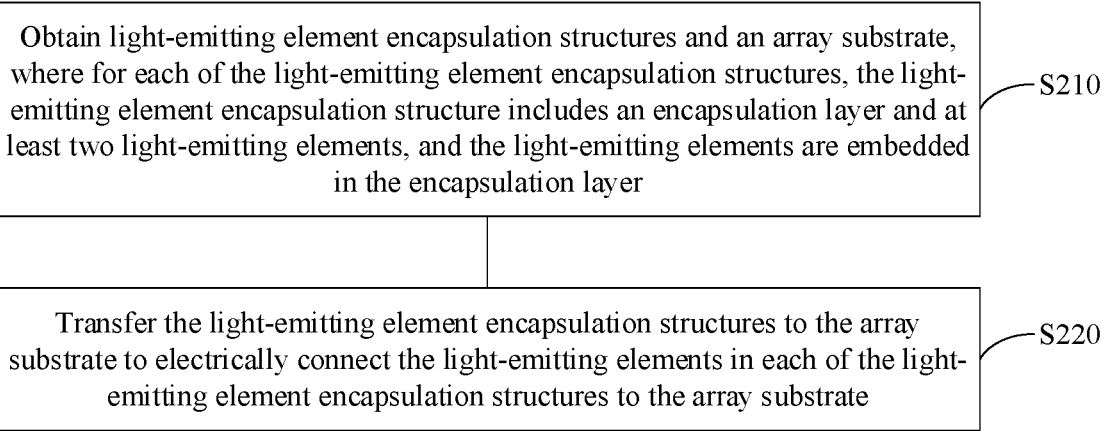

Obtain light-emitting element encapsulation structures and an array substrate, where for each of the light-emitting element encapsulation structures, the light-emitting element encapsulation structure includes an encapsulation layer and at least two light-emitting elements, and the light-emitting elements are embedded in the encapsulation layer ⟋S210

Transfer the light-emitting element encapsulation structures to the array substrate to electrically connect the light-emitting elements in each of the light-emitting element encapsulation structures to the array substrate ⟋S220

Figure 27

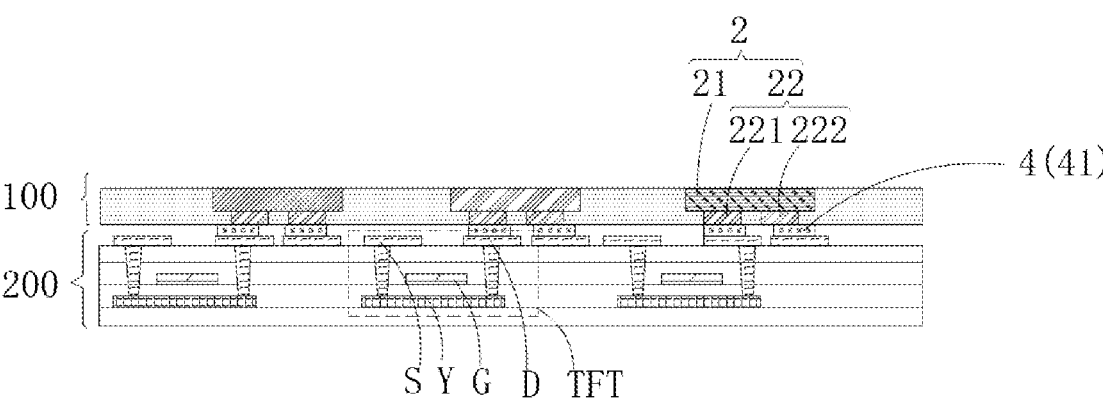

Figure 28

LIGHT-EMITTING ELEMENT ENCAPSULATION STRUCTURE, DISPLAY PANEL, DISPLAY DEVICE, AND MANUFACTURING METHODS

This application claims priority to Chinese Patent Application No. 202211733524.2, titled "LIGHT-EMITTING ELEMENT ENCAPSULATION STRUCTURE, DISPLAY PANEL, DISPLAY DEVICE, AND MANUFACTURING METHODS", filed on Dec. 30, 2022 with the China National Intellectual Property Administration, which is hereby incorporated by reference in its entirety.

FIELD

The present disclosure relates to the field of electronic products, and in particular to a light-emitting element encapsulation structure, a display panel, a display device, a method for manufacturing a light-emitting element encapsulation structure, and a method for manufacturing a display panel.

BACKGROUND

Light emitting diodes (LEDs) are widely used in fields such as lighting and displaying due to small size, low power, long service life, high brightness, and other advantages.

Micro LEDs are manufactured separately in the form of chips with dimensions in the micron scale. Thus, in manufacturing a display device, it is required to transfer a large number of Micro LED chips to an array substrate. Due to the size limitation of Micro LEDs, accuracy requirements for transfer equipment are high in transferring the large number of Micro LED chips, resulting in difficulty to transfer.

Therefore, a light-emitting element encapsulation structure, a display panel, a display device, a method for manufacturing a light-emitting element encapsulation structure, and a method for manufacturing a display panel are urgently required.

SUMMARY

A light-emitting element encapsulation structure, a display panel, a display device, a method for manufacturing a light-emitting element encapsulation structure, and a method for manufacturing a display panel are provided according to the embodiments of the present disclosure. The light-emitting element encapsulation structure includes an encapsulation layer and at least two light-emitting elements. The light-emitting elements are embedded in the encapsulation layer. The overall size of the light-emitting element encapsulation structure is greater than the size of one light-emitting element. A greater size of the light-emitting element encapsulation structure indicates a lower requirement for accuracy of transfer equipment, effectively reducing the difficulty of transfer and improving the transfer efficiency.

In one embodiment, a light-emitting element encapsulation structure is provided according to an embodiment of the present disclosure. The light-emitting element encapsulation structure includes an encapsulation layer and at least two light-emitting elements. The light-emitting elements are embedded in the encapsulation layer.

In one embodiment, a method for manufacturing a light-emitting element encapsulation structure is provided according to an embodiment of the present disclosure. The method includes: obtaining a first temporary substrate; arranging at least two light-emitting elements on one side of the first temporary substrate; forming an encapsulation layer, where the encapsulation layer at least fills around the light-emitting elements; and peeling off the first temporary substrate to obtain the light-emitting element encapsulation structure.

In one embodiment, a method for manufacturing a display panel is provided according to an embodiment of the present disclosure. The method includes: obtaining light-emitting element encapsulation structures and an array substrate, where for each of the light-emitting element encapsulation structures, the light-emitting element encapsulation structure includes an encapsulation layer and at least two light-emitting elements, and the light-emitting elements are embedded in the encapsulation layer; and transferring the light-emitting element encapsulation structures to the array substrate to electrically connect the light-emitting elements in each of the light-emitting element encapsulation structures to the array substrate.

In one embodiment, a display panel is provided according to an embodiment of the present disclosure. The display panel includes: the light-emitting element encapsulation structures described in the above embodiments and an array substrate. The light-emitting elements in the light-emitting element encapsulation structures are electrically connected to the array substrate.

In one embodiment, a display device is provided according to an embodiment of the present disclosure. The display device includes the display panel described in the above embodiments.

Compared with the conventional technology, the light-emitting element encapsulation structure according to the embodiments of the present disclosure includes an encapsulation layer and at least two light-emitting elements. The light-emitting elements are embedded in the encapsulation layer. In performing the transfer process, the light-emitting element encapsulation structure may be transferred as a whole. Each light-emitting element encapsulation structure includes an encapsulation layer and at least two light-emitting elements. The overall size of the light-emitting element encapsulation structure is greater than the size of one light-emitting element. A greater size of the light-emitting element encapsulation structure indicates a lower requirement for accuracy of transfer equipment, effectively reducing the difficulty of transfer and improving the transfer efficiency. In addition, in the embodiments, each of the light-emitting elements in the light-emitting element encapsulation structure may be detected separately to determine whether the light-emitting element is damaged, facilitating the detection process and achieving accurate results. In a case of damage, a single damaged light-emitting element or the entire light-emitting element encapsulation structure may be repaired or replaced without affecting other light-emitting element encapsulation structures, to improve production yield and reducing production costs.

BRIEF DESCRIPTION OF THE DRAWINGS

In order to more clearly illustrate the embodiments of the present disclosure, drawings in the embodiments of the present disclosure are briefly introduced below. Apparently, the drawings described below are only some embodiments of the present disclosure.

FIG. 27 is a flowchart of a method for manufacturing a display panel according to an embodiment of the present disclosure;

FIG. 28 is a cross-sectional view of a structure obtained in a step of a method for manufacturing a display panel according to an embodiment of the present disclosure;

DETAILED DESCRIPTION OF THE EMBODIMENTS

Features and exemplary embodiments of various aspects of the present disclosure are described in detail below. In the detailed description below, many specific details are described to provide a comprehensive understanding of the present disclosure. The present disclosure can be implemented without some of these specific details. The following description of embodiments is only to provide a better understanding of the present disclosure by illustrating examples.

It should be noted that in this specification, relational terms such as "first" and "second" are only used to distinguish one entity or operation from another entity or operation, and do not necessarily require or imply any actual relationship or order between the entities or operations. In one embodiment, terms such as "comprise", "include", or any other variation thereof are intended to cover non-exclusive inclusion, and a process, a method, article, or device that includes a series of elements not only includes the series of elements, but also other elements not explicitly listed, or also includes elements inherent in such a process, method, article, or device. Without further limitations, an element limited by the statement "comprise . . . " does not exclude the existence of other identical element in the process, method, article, or device that includes the element.

In the conventional technology, the size of light-emitting elements in a display panel is small, for example, the size of the light-emitting elements is less than or equal to 50 μm. Due to the small size of the light-emitting elements, the requirement for the accuracy of the transfer equipment in a mass transfer process is high, it is difficult to transfer, and subsequent detection and repair are difficult and costly.

In order to solve the above problems, the light-emitting element encapsulation structure according to the embodiments of the present disclosure includes an encapsulation layer and at least two light-emitting elements. The light-emitting elements are embedded in the encapsulation layer. The overall size of the light-emitting element encapsulation structure is greater than the size of one light-emitting element. A greater size of the light-emitting element encapsulation structure indicates a lower requirement for accuracy of transfer equipment, effectively reducing the difficulty of transfer and improving the transfer efficiency.

In order to better understand the present disclosure, a light-emitting element encapsulation structure, a display panel, a display device, a method for manufacturing a light-emitting element encapsulation structure, and a method for manufacturing a display panel according to the embodiments of the present disclosure are described in detail below with reference to FIGS. 1 to 34.

Figure 1:
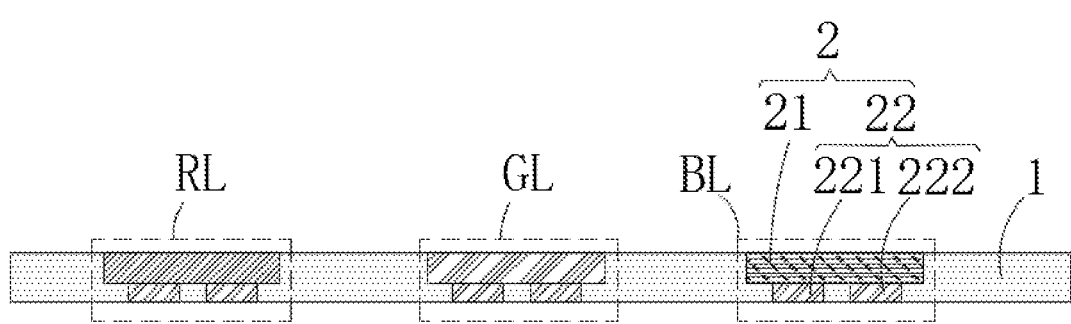
FIG. 1 is a schematic structural diagram showing film layers of a light-emitting element encapsulation structure according to an embodiment of the present disclosure.

Reference is made to FIG. 1, which is a schematic structural diagram showing film layers of a light-emitting element encapsulation structure according to an embodiment of the present disclosure. The light-emitting element encapsulation structure according to the embodiment of the present disclosure includes: an encapsulation layer 1 and at least two light-emitting elements 2. The light-emitting elements 2 are embedded in the encapsulation layer 1.

The light-emitting element encapsulation structure according to the embodiment of the present disclosure includes an encapsulation layer 1 and at least two light-emitting elements 2. The light-emitting elements 2 are embedded in the encapsulation layer 1. In performing a transfer process, the light-emitting element encapsulation structure may be transferred. Each light-emitting element encapsulation structure includes an encapsulation layer 1 and at least two light-emitting elements 2. The overall size of the light-emitting element encapsulation structure is greater than the size of one light-emitting element 2. A greater size of the light-emitting element encapsulation structure indicates a lower requirement for accuracy of transfer equipment, effectively reducing the difficulty of transfer and improving the transfer efficiency. In addition, in the embodiments, each of the light-emitting elements 2 in the light-emitting element encapsulation structure may be detected separately to determine whether the light-emitting element is damaged, facilitating the detection process and achieving accurate results. In a case of damage, a single damaged light-emitting element 2 or the entire light-emitting element encapsulation structure may be repaired or replaced without affecting other light-emitting element encapsulation structures, to improve production yield and reducing production costs.

In the embodiment, the light-emitting elements 2 may have a light emitting diode (LED) chip structure, such as a Micro LED (Micro Light light-emitting Diode) with a size less than 50 μm. Since the light-emitting element encapsulation structure according to the embodiment of the present disclosure includes at least two light-emitting elements 2 that are embedded in the encapsulation layer 1, the size of the light-emitting element encapsulation structure is greater than or equal to 100 μm. The size of Mini LED (Small Light light-emitting Diode) is less than 100 μm. In a case of low requirement for the accuracy of the transfer equipment, the light-emitting element encapsulation structure may be transferred by using Mini-LED transfer equipment.

The LED chip structure includes a horizontal structure and a vertical structure. The light-emitting element encapsulation structure according to the embodiment of the present disclosure may applied to an LED having a formal structure, an LED having a vertical structure, and an LED having an inverted structure.

In the embodiment of the present disclosure, the light-emitting elements 2 are embedded in the encapsulation layer 1. The term "embedded" indicates that the light-emitting elements 2 are partially wrapped in the space of the encapsulation layer 1, as long as the light-emitting elements 2 can be fixed through the encapsulation layer 1. The term "embedded" does not indicate that the light-emitting elements 2 are completely buried in the encapsulation layer 1. The light-emitting elements 2 may be covered by other film layers or may be electrically connected to other components. For example, the encapsulation layer 1 may be arranged only around the light-emitting elements 2 without covering the upper and lower surfaces of the light-emitting elements 2.

Figure 2:
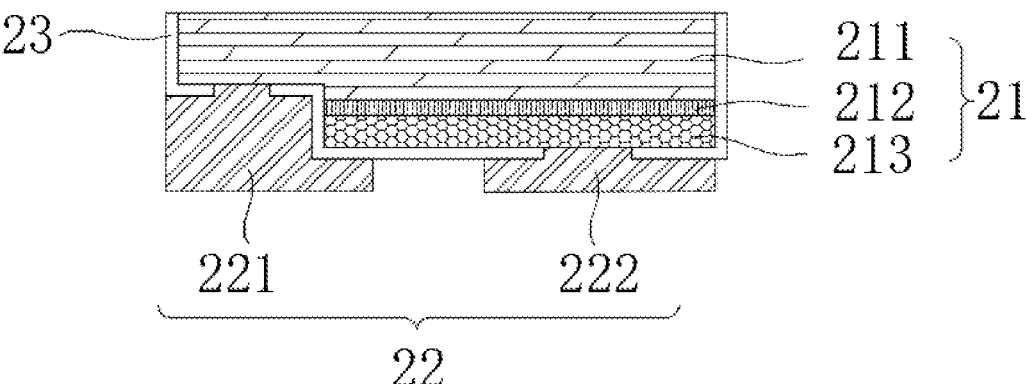
FIG. 2 is a schematic structural diagram showing film layers of a light-emitting element according to an embodiment of the present disclosure.

Reference is made to FIG. 2, which is a schematic structural diagram showing film layers of a light-emitting element 2 according to an embodiment of the present disclosure. FIG. 2 shows an example in which an LED chip has a horizontal structure. In some embodiments, the light-emitting element 2 includes a main body 21 and electrodes 22, and the electrodes 22 are exposed from the encapsulation layer 1. In an embodiment, the main body 21 includes various film layers formed in an epitaxy manner. For example, the main body 21 includes an N-type semiconductor layer 211, a quantum well layer 212 and a P-type semiconductor layer 213 that are stacked together. A stacked structure formed by the quantum well layer 212 and the P-type semiconductor layer 213 is exposed from a part of a surface of the N-type semiconductor layer 211. In the embodiment, the N-type semiconductor layer 211 may be an N-type doped GaN layer, the P-type semiconductor layer 213 may be a P-type doped GaN layer, and the quantum well layer 212 may be an InGaN multiple quantum well layer. The materials of the light-emitting element are not limited to the above materials, and may include the materials of the light-emitting diodes according to the conventional technology.

In a case that the light-emitting element 2 adopts a horizontal structure, the electrodes 22 include a first electrode 221 and a second electrode 222. The first electrode 221 and the second electrode 222 are located at a same side of the main body 21, and the first electrode 221 and the second electrode 222 are exposed from the encapsulation layer 1.

The second electrode 222 is electrically connected to the N-type semiconductor layer 211, and the first electrode 221 is electrically connected to the P-type semiconductor layer 213. In the embodiment, the first electrode 221 and the second electrode 222 are exposed from the encapsulation layer 1, and the first electrode 221 and the second electrode 222 subsequently are electrically connected to other film layers or components to drive the light-emitting element 2.

On the basis of the above embodiments, in an embodiment of the present application, the light-emitting element 2 further includes an intrinsic semiconductor layer such as an intrinsic GaN layer. The intrinsic semiconductor layer is located at a side of the main body 21 away from the electrodes 22. The intrinsic semiconductor layer includes a buffer layer, a low-temperature semiconductor layer and a high-temperature semiconductor layer. The buffer layer is configured to have a protrusion on a surface of a side of the buffer layer away from the main body 21, improving the light output efficiency of the light-emitting element 2. The high-temperature semiconductor layer is configured to improve the flatness of the plane formed by the main body 21. The low-temperature semiconductor layer is an intermediate layer between the buffer layer and the high-temperature semiconductor layer. In other embodiments of the present disclosure, the light-emitting element 2 may include other structures, which are not limited in the present disclosure and depend on the situations.

In some embodiments, the electrodes 22 form an electrical connection structure of the light-emitting element encapsulation structure.

It should be noted that the limitation that the electrodes 22 of the light-emitting element 2 form the electrical connection structure of the light-emitting element encapsulation structure indicates that after performing the transfer process, the electrodes 22 of the light-emitting element 2 are directly and electrically connected to the array substrate 200. It is unnecessary to connect the electrodes 22 of the light-emitting element 2 to the array substrate 200 via a rewiring layer 3 which is to be mentioned later, to simplify the structure of the light-emitting element encapsulation structure, and reducing the production costs and preparation difficulties.

Figure 3:
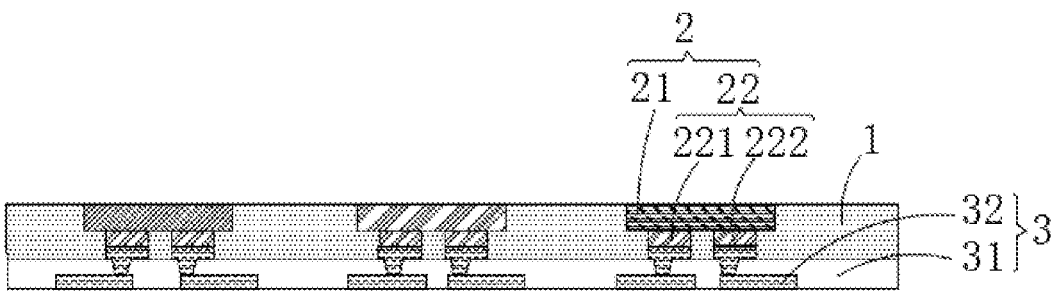
FIG. 3 is a schematic structural diagram showing film layers of a light-emitting element encapsulation structure according to another embodiment of the present disclosure.

Reference is made to FIG. 3, which is a schematic structural diagram showing film layers of a light-emitting element encapsulation structure according to an embodiment of the present disclosure. In some embodiments, the light-emitting element encapsulation structure further includes a rewiring layer 3. The rewiring layer 3 includes an insulation structure 31 and an electrical connection part 32. The light-emitting elements 2 are arranged on the rewiring layer 3, and are electrically connected to the electrical connection part 32.

Considering that there may be size differences or position differences between the positions of the electrodes 22 of the light-emitting elements 2 and the corresponding connection positions on the array substrate 200, in the embodiment, the rewiring layer 3 is provided, and the electrodes 22 of the light-emitting elements 2 are electrically connected to the electrical connection part 32, and the size differences or position differences between the positions of the electrodes 22 of the light-emitting elements 2 and the corresponding connection positions on the array substrate 200 are adjusted based on the displacement of the electrical connection part 32 relative to the electrodes 22. That is, in the embodiment, the electrical connection part 32 of the rewiring layer 3 is electrically connected to the array substrate 200. The electrical connection part 32 plays a role of performing transition connection and adjusting the connection positions, and the size of the substrate to be electrically connected is adjusted, improving the reliability of the electrical connection between the light-emitting elements 2 of the light-emitting element encapsulation structure and the array substrate 200.

In the embodiment, in addition to the electrically connection between the light-emitting elements 2 and the electrical connection part 32, the rewiring layer 3 directly contacts the encapsulation layer 1.

The electrical connection part 32 may be made of materials with good conductivity. For example, the electrical connection part 32 may be made of a single-layer metal, such as silver, aluminum, molybdenum, lithium, magnesium, ytterbium, calcium and indium; or may be made of a composite metal, such as titanium-aluminum-titanium; or may be made of other conductive materials, such as indium tin oxide, zinc tin oxide, or transparent conductive polymers (such as polyaniline). The materials of the electrical connection part 32 are not limited in the present disclosure.

Figure 4:
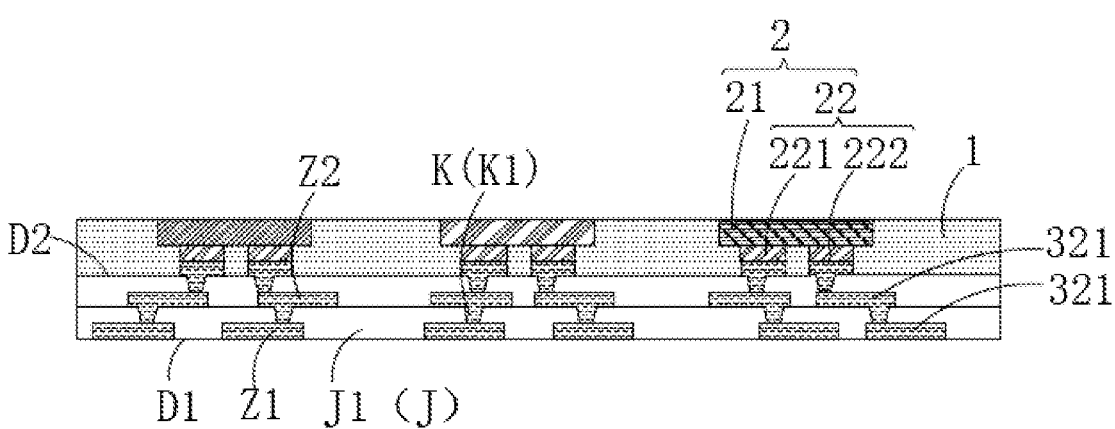
FIG. 4 is a schematic structural diagram showing film layers of a light-emitting element encapsulation structure according to another embodiment of the present disclosure.

Reference is made to FIG. 4, which is a schematic structural diagram showing film layers of a light-emitting element encapsulation structure according to another embodiment of the present disclosure. In some embodiments, the insulation structure 31 includes at least two insulation layers J, the electrical connection part 32 includes at least two sub electrical connection parts 321, and the sub electrical connection parts 321 arranged on opposite sides of an insulation layer J are electrically connected via through a hole K of the insulation layer J. The material of the insulation layer J includes an organic material.

It should be noted that the sub electrical connection parts 321 arranged on opposite sides of one insulation layer J are the sub electrical connection parts 321 arranged on the upper and lower sides of the insulation layer J. Since it is required to electrically connect the two sub electrical connection parts 321 to transmit signals, a hole K are defined on the insulation layer J by means of etching and the like, and the sub electrical connection parts 321 on opposite sides of the insulation layer J are electrically connected via the through hole K of the insulation layer J.

In the embodiment, the material of the insulation layer J may be an organic material, such as light transmitting polyimide (PI), polystyrene, polyethylene terephthalate, parylene, polyethersulfone, and polyethylene naphthalate. Due to the better flatness of the organic materials compared to inorganic materials, in a case that the insulation layer J is made of organic materials, a flat surface may be formed on the surface of the insulation layer J facing the encapsulation layer 1, and the sub electrical connection parts 321, that arranged on one insulation layer J and electrically connected to the two electrodes of the light-emitting element 2, have no height difference, facilitating the bonding process between the light-emitting element 2 and the sub electrical connection parts 321, improving the bonding yield, and improving the stability of the connection between the light-emitting element 2 and the electrical connection parts 32.

In one embodiment, the insulation layer J may be made of inorganic materials with good insulation, such as silicon nitride, silicon oxide and silicon oxynitride, which is not limited in the present disclosure.

Figure 5:
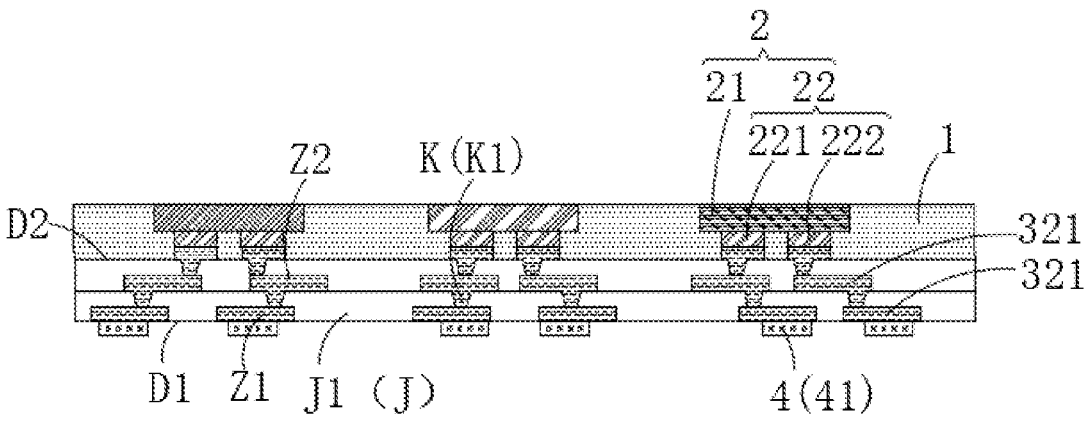
FIG. 5 is a schematic structural diagram showing film layers of a light-emitting element encapsulation structure according to another embodiment of the present disclosure.

Reference is made to FIG. 5, which is a schematic structural diagram showing film layers of a light-emitting element encapsulation structure according to another embodiment of the present disclosure. In some embodiments, the insulation structure 31 includes at least two insulation layers J, the electrical connection part 32 includes at least two sub electrical connection parts 321, and the sub electrical connection parts 321 arranged on opposite sides of an insulation layer J are electrically connected via through a hole K of the insulation layer J. The rewiring layer 3 includes a first surface D1 and a second surface D2 which are opposite to each other, and the second surface D2 is arranged between the first surface D1 and the light-emitting elements 2. The insulation layers J of the insulation structure 31 includes a first insulation layer J1. The first surface D1 of the rewiring layer 3 includes a surface of the first insulation layer J1. The sub electrical connection parts 321 of the electrical connection part 32 include a first sub electrical connection part Z1, and the first surface D1 of the rewiring layer 3 further includes a surface of the first sub electrical connection part Z1. The first sub electrical connection part Z1 is embedded in the first insulation layer J1.

It should be noted that in the embodiment, that the first sub electrical connection part Z1 is embedded in the first insulation layer J1 indicates that except for the surface of the first sub electrical connection part Z1 away from the light-emitting elements 2 which is a part of the first surface D1 of the rewiring layer 3, all other surfaces of the first sub electrical connection part Z1 are buried in the first insulation layer J1. The surface of the first insulation layer J1 away from the light-emitting elements 2 and the surface of the first sub electrical connection part Z1 away from the light-emitting elements 2 form the first surface D1 of the rewiring layer 3. In the embodiment, the first sub electrical connection part Z1 may be formed firstly, and then the first insulation layer J1 is covered on the first sub electrical connection part Z1, and the first sub electrical connection part Z1 is buried in the first insulation layer J1 except for the surface of the first sub electrical connection part Z1 away from the light-emitting elements 2. Since the surface of the first sub electrical connection part Z1 away from the light-emitting elements 2 is exposed from the first insulation layer J1, other film layers or components may be directly connected to the first sub electrical connection part Z1 without the through hole K, facilitating the connection.

In an embodiment, the sub electrical connection part 321 arranged on the first insulation layer J1 and facing the light-emitting elements 2 is a second sub electrical connection part Z2. The second sub electrical connection part Z2 is connected to the first sub electrical connection part Z1 via a first through hole K1 of the first insulation layer J1. The size of the first through hole K1 is less than the size of the first sub electrical connection part Z1.

In the embodiment, the sizes of the first through hole K1 or the size of the first sub electrical connection part Z1 may be understood as an area of an orthogonal projection of the first through hole K1 on the encapsulation layer 1, or an area of an orthogonal projection of the first sub electrical connection part Z1 on the encapsulation layer 1, or a maximum length of the first through hole K1 or a maximum length of the first sub electrical connection part Z1 in a direction parallel to a plane where the first insulation layer J1 is located.

A greater the size of the first sub electrical connection part Z1 indicates a greater area of the surface for connection of the first sub electrical connection part Z1 away from the light-emitting elements 2. Compared to the connection with other film layers or components via a through hole K, the connection with other film layers or components may be performed by using the first sub electrical connection part Z1 with a size greater than the first through hole K1 in the embodiment of the present disclosure, achieving convenient, accurate and stable connections.

Referring to FIG. 5, in some embodiments, the light-emitting element encapsulation structure further includes a binding structure 4. The binding structure 4 is arranged on a side of the rewiring layer 3 away from the light-emitting elements 2. The binding structure 4 includes a binding part 41, and the binding part 41 is electrically connected to the electrical connection part 32.

It should be noted that the material of the binding part 41 includes at least one of tin, silver, and copper. In one embodiment, the binding part 41 may be formed by tin balls that are obtained by ball planting process. The light-emitting element encapsulation structure and the array substrate 200 are bound and connected together through the tin balls. In the embodiment, the binding part 41 is electrically connected to the electrical connection part 32.

The material of the binding part 41 may be anisotropic conductive film (ACF).

In one embodiment, in a case that the rewiring layer 3 only includes an insulation structure 31 including one insulation layer and an electrical connection part 32 including one sub electrical connection part, the binding part 41 directly contacts the surface of the electrical connection part 32 away from the light-emitting elements 2.

In an embodiment, as shown in FIG. 5, the insulation structure 31 includes at least two insulation layers J, the electrical connection part 32 includes at least two sub electrical connection parts 321, and the sub electrical connection parts 321 arranged on opposite sides of an insulation layer J are electrically connected via a through hole K of the insulation layer J. The sub electrical connection parts 321 of the electrical connection part 32 include a first sub electrical connection part Z1, and the binding part 41 directly contacts the first sub electrical connection part Z1.

In the embodiment, the first sub electrical connection part Z1 is the sub electrical connection part 321 farthest from the light-emitting elements 2 among the sub electrical connection parts 321, which is the sub electrical connection part 321 located at the bottom. The binding part 41 directly contacts the first sub electrical connection part Z1, that is, there is no insulation layer J between the binding part 41 and the first sub electrical connection part Z1, and it is unnecessary to perform connection via the through hole K of the insulation layer J. The area of the surface for connection of the first sub electrical connection part Z1 away from the light-emitting elements 2 is great, facilitating accurate connection between the binding part 41 and the first sub electrical connection part Z1.

As shown in FIG. 5, in some embodiments, the binding portion 41 at least partially does not overlap the light-emitting elements 2.

In the embodiment, the position of the first sub electrical connection part Z1 may be significantly changed relative to the light-emitting elements 2 based on the displacement of the electrical connection part 32 relative to the electrodes 22 and the relative displacements between the sub electrical connection parts 321 in the direction parallel to the plane where the insulation layer J is located, and the binding portion 41 connected to the first sub electrical connection part Z1 at least partially does not overlap the light-emitting elements 2, and the connection position between the binding part 41 and the array substrate 200 are adjusted, facilitating the electrical connection between the binding part 41 and the array substrate 200.

Figure 6:
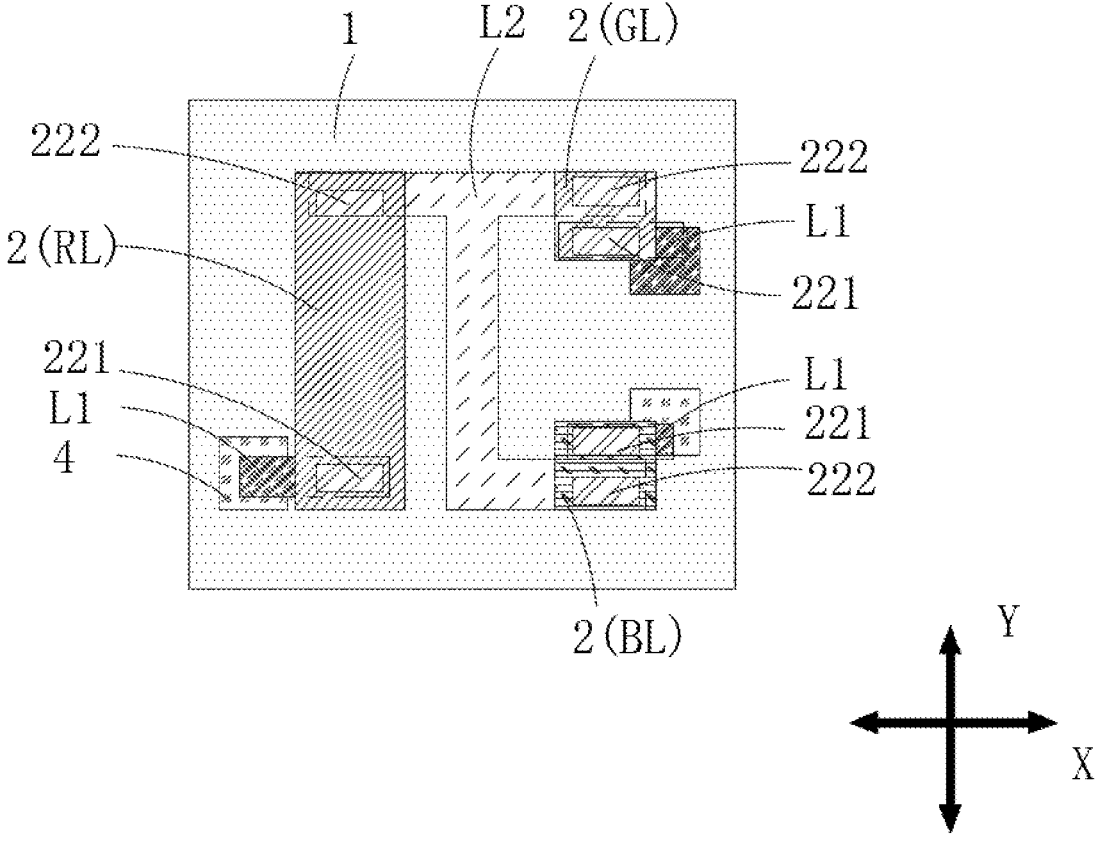
FIG. 6 is a top view of a light-emitting element encapsulation structure according to an embodiment of the present disclosure.

Reference is made to FIG. 6, which is a top view of a light-emitting element encapsulation structure according to an embodiment of the present disclosure. In some embodiments, the light-emitting element encapsulation structure further includes a rewiring layer 3. The rewiring layer 3 includes an insulation structure 31 and an electrical connection part 32. The electrical connection part 32 includes first electrical connection parts L1 and a second electrical connection part L2. The first electrical connection parts L1 and the second electrical connection part L2 are arranged on a same layer. The light-emitting elements 2 are arranged on the rewiring layer 3. For each of the light-emitting elements, the first electrode 221 of the light-emitting element 2 is connected to a different first electrical connection part L1, and the second electrode 222 of the light-emitting element 2 is connected to the same second electrical connection part L2.

It should be understood that the first electrical connection parts L1 and the second electrical connection part L2 are arranged on the same layer. The first electrical connection parts L1 are electrically connected to the first electrodes 221 of the light-emitting elements 2, and the second electrical connection part L2 is electrically connected the second electrodes 222 of the light-emitting elements 2. In the embodiment, the second electrodes 222 of the light-emitting elements 2 are connected to the same second electrical connection part L2, that is, the second electrodes 222 of the light-emitting elements 2 may receive a same voltage signal, avoiding emission differences between the light-emitting elements 2 due to different voltage signals received by the second electrodes 222, to improve the uniformity of light emitted by the light-emitting elements 2. In addition, since the second electrodes 222 of each light-emitting elements 2 are connected to the same second electrical connection part L2, the number of signal lines in the array substrate 200 required for transmitting signals to the second electrical connection part L2 can be reduced, increasing the wiring space of the array substrate 200 and reducing the production costs.

Figure 7:
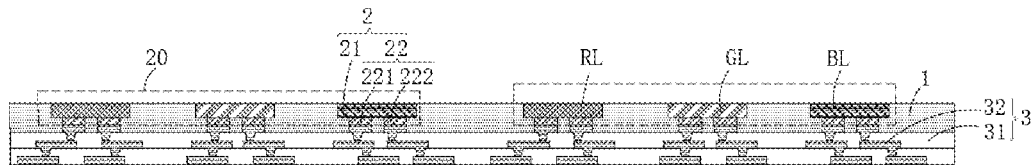
FIG. 7 is a schematic structural diagram showing film layers of a light-emitting element encapsulation structure according to another embodiment of the present disclosure.

Reference is made to FIG. 7, which is a schematic structural diagram showing film layers of a light-emitting element encapsulation structure according to another embodiment of the present disclosure. In order to facilitate the light-emitting elements 2 in a light-emitting element encapsulation structure emitting white light through light mixing, in some embodiments, the light-emitting element encapsulation structure includes at least one light-emitting element group 20, and the light-emitting element group includes a red light-emitting element RL, a green light-emitting element GL, and a blue light-emitting element BL.

In the light-emitting element encapsulation structure, only one light-emitting element group 20 may be arranged. That is, a light-emitting element encapsulation structure includes a red light-emitting element RL, a green light-emitting element GL, and a blue light-emitting element BL, facilitating light mixing. Apparently, in order to increase the overall size of the light-emitting element encapsulation structure, the light-emitting element encapsulation structure may include two, three, or more light-emitting element groups 20, which is not limited in the present disclosure.

The red light-emitting element RL, the green light-emitting element GL, and the blue light-emitting element BL are made of different semiconductor materials to emit light of different colors. The luminous efficiencies of the light-emitting elements 2 of different colors are different due to different semiconductor materials. Due to the low luminous efficiency of the red light-emitting element RL, in order to match the brightness between the red light, the green light and the blue light, the area of the red light-emitting element RL is great, that is, the area of the red light-emitting element RL is greater than the area of the green light-emitting element GL and is greater than the area of the blue light-emitting element BL.

The area mentioned above may be understood as a light-emitting area of the red light-emitting element RL, the green light-emitting element GL, or the blue light-emitting element BL from a top view angle. A greater area indicates a greater brightness, and the problem of low brightness of the red light caused by the low luminous efficiency of the red light-emitting element RL is solved.

As shown in FIG. 6, in some embodiments, in the light-emitting element group 20, in a first direction X, the red light-emitting element RL and the green light-emitting element GL are arranged with a space interval, and the red light-emitting element RL and the blue light-emitting element BL are arranged with a space interval; in a second direction Y, the green light-emitting element GL and the blue light-emitting element BL are arranged with a space interval; and the first direction X intersects with the second direction Y. A first electrical connection part L1 connected to the red light-emitting element RL is at least partially arranged on a side of the red light-emitting element RL away from the green light-emitting element GL, a first electrical connection part L1 connected to the green light-emitting element GL is at least partially arranged on a side of the green light-emitting element GL away from the red light-emitting element RL, and a first electrical connection part L1 connected to the blue light-emitting element BL is at least partially arranged on a side of the blue light-emitting element BL away from the red light-emitting element RL. The second electrical connection part L2 is at least partially arranged in the space interval between the red light-emitting element RL and the green light-emitting element GL and in the space interval between the red light-emitting element RL and the blue light-emitting element BL.

It should be understood that since the second electrical connection part L2 is connected to the red light-emitting element RL, the green light-emitting element GL and the blue light-emitting element BL, the second electrical connection part L2 may be at least partially arranged in the space interval between the red light-emitting element RL and the green light-emitting element GL and in the space interval between the red light-emitting element RL and the blue light-emitting element BL, facilitating connecting the second electrical connection part L2 to the red light-emitting element RL, the green light-emitting element GL and the blue light-emitting element BL. The first electrical connection parts L1 are arranged on an outer side of each of the light-emitting elements 2, that is, on a side of each of the light-emitting elements 2 away from the space interval between the red light-emitting element RL and the green light-emitting element GL and in the space interval between the red light-emitting element RL and the blue light-emitting element BL, and the first electrical connection parts L1 is separated from the second electrical connection part L2, avoiding mutual interference between the first electrical connection parts L1 and the second electrical connection part L2.

In the first direction X, the green light-emitting element GL and the blue light-emitting element BL are arranged at a same side of the red light-emitting element RL, and the red light-emitting element RL is arranged separately, to increase the area of the red light-emitting element RL and adjusting the brightness of the light from the red light-emitting element RL. The first direction X may be a direction along a width of the red light-emitting element RL, and the second direction Y may be a direction along a length of the red light-emitting element RL.

In an embodiment, as shown in FIG. 6, a cross-section of the second electrical connection part L2 is h-shaped in a direction parallel to a plane where the insulation layer J is located.

As shown in FIG. 6, the cross-section of the second electrical connection part L2 is similar to an inverted "h". A top of the "h" is connected to a second electrode 222 of the red light-emitting element RL, and bottoms of the "h" are respectively connected to a second electrode 222 of the green light-emitting element GL and a second electrode 222 of the blue light-emitting element BL. Apparently, according to different shapes and arrangements of the red light-emitting element RL, the green light-emitting element GL and the blue light-emitting element BL, the shape of the cross-section of the second electrical connection part L2 changes, which is not limited in the present disclosure.

In some embodiments, as shown in FIG. 1, the light-emitting element encapsulation structure includes at least two light-emitting elements 2 emitting light with different colors.

Based on different arrangements of the light-emitting elements 2, the numbers and the colors of the light-emitting elements 2 in the light-emitting element encapsulation structure are different, may be determined according to actual requirements, and are not limited in the present disclosure.

Figure 8:
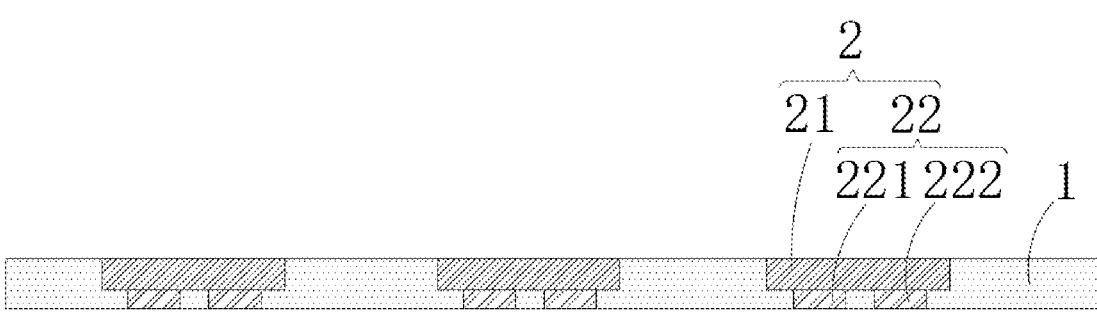
FIG. 8 is a schematic structural diagram showing film layers of a light-emitting element encapsulation structure according to another embodiment of the present disclosure.

Reference is made to FIG. 8, which is a schematic structural diagram showing film layers of a light-emitting element encapsulation structure according to another embodiment of the present disclosure. The light-emitting element encapsulation structure includes at least two light-emitting elements 2 emitting light with a same color. Since the structure and the material of the light-emitting elements 2 emitting light with a same color are same, the process manufacturing a light-emitting element encapsulation structure including light-emitting elements 2 emitting light with a same color is simple and convenient.

In some embodiments, as shown in FIG. 1, the encapsulation layer 1 is arranged around the light-emitting elements 2. In a direction perpendicular to a plane where the encapsulation layer 1 is located, an upper surface of the encapsulation layer 1 is arranged to be lower than or flush with upper surfaces of the light-emitting elements 2.

It should be understood that each of the light-emitting elements 2 includes a main bode 21 and electrodes 22. For each of the light-emitting elements 2, the upper surface of the light-emitting element 2 may be a surface of the main body 21 away from the electrodes 22. The upper surface of the encapsulation layer 1 is lower than the upper surfaces of the light-emitting elements 2, or the upper surface of the encapsulation layer 1 is flush with the upper surfaces of the light-emitting elements 2. That is, the encapsulation layer 1 does not protrude in a direction away from the electrodes 22 relative to the main body 21, avoiding the impact of the encapsulation layer 1 on the light emitted from the main body 21 and ensuring the brightness of the light-emitting elements 2.

Figure 9:
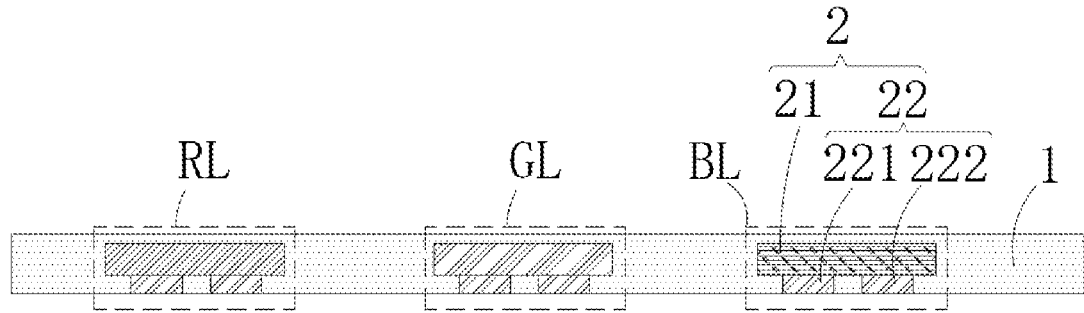
FIG. 9 is a schematic structural diagram showing film layers of a light-emitting element encapsulation structure according to another embodiment of the present disclosure.

In other embodiments, reference is made to FIG. 9, which is a schematic structural diagram showing film layers of a light-emitting element encapsulation structure according to another embodiment of the present disclosure. The encapsulation layer 1 includes a part surrounding the light-emitting elements 2 and a part covering upper surfaces of the light-emitting elements 2.

It should be understood that in the embodiment of the present disclosure, the encapsulation layer 1 covers the upper surfaces of the light-emitting elements 2 to protect the light-emitting elements 2. Apparently, the thickness of the part of the encapsulation layer 1 covering the upper surfaces of the light-emitting elements 2 should not be too great. In a case of great thickness of the part of the encapsulation layer 1 covering the upper surfaces of the light-emitting elements 2, the brightness of the light emitted by the light-emitting elements 2 passing through the encapsulation layer 1 is lost. In the embodiment, the encapsulation layer 1 may be a single inorganic layer structure, or may be an inorganic-organic-inorganic composite structure. The inorganic material may be silicon nitride, silicon oxide or silicon oxynitride, and the organic material may be an organic resin material such as polyimide.

Figure 10:
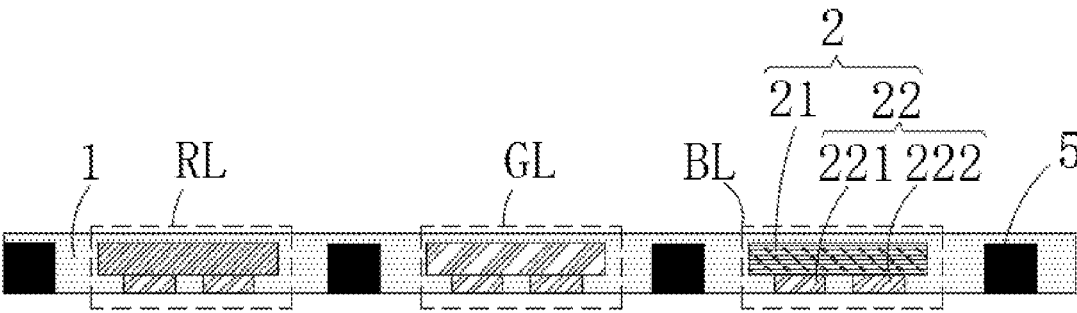
FIG. 10 is a schematic structural diagram showing film layers of a light-emitting element encapsulation structure according to another embodiment of the present disclosure.
Figure 11:
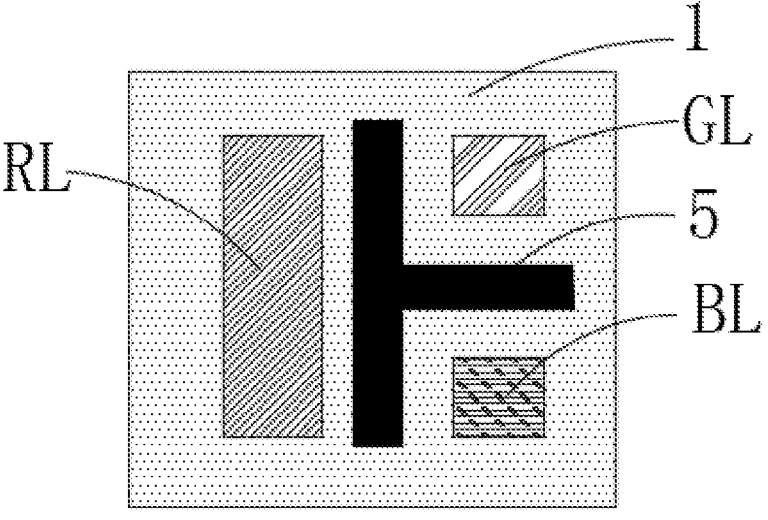
FIG. 11 is a top view of a light-emitting element encapsulation structure according to another embodiment of the present disclosure.

Referring to FIGS. 10 to 11, FIG. 10 is a schematic structural diagram showing film layers of a light-emitting element encapsulation structure according to another embodiment of the present disclosure, and FIG. 11 is a top view of a light-emitting element encapsulation structure according to another embodiment of the present disclosure. In some embodiments, the light-emitting element encapsulation structure further includes a shading part 5. The shading part 5 is at least arranged between adjacent light-emitting elements 2.

It should be noted that the shading part 5 may block and absorb the light emitted by the light-emitting elements 2 towards sides, avoiding mutual interference between light emitted by adjacent light-emitting elements 2. The shading part 5 may be made of materials with good light-absorption performance, such as a black colloid material or a resin material for preparing black matrices.

In an embodiment, in a direction perpendicular to a plane where the encapsulation layer 1 is located, the height of the shading part 5 is greater than or equal to the heights of the light-emitting elements 2.

It should be noted that, that the height of the shading part 5 is greater than the heights of the light-emitting elements 2 indicates that a height of an upper surface of the shading part 5 is greater than heights of upper surfaces of the light-emitting elements 2, and that the height of the shading part 5 is equal to the height of the light-emitting elements 2 indicates that the upper surface of the shading part 5 is flush with the upper surfaces of the light-emitting elements 2, to ensure the blocking effect of the shading part 5 on the light emitted by the light-emitting elements 2.

Figure 12:
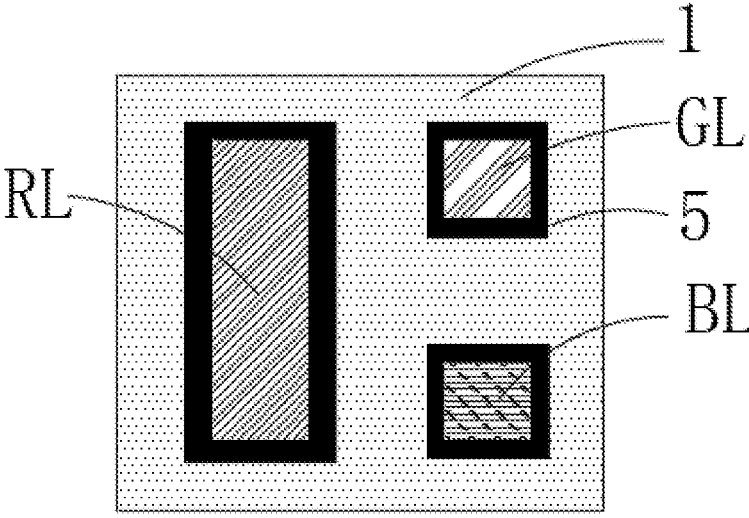
FIG. 12 is a top view of a light-emitting element encapsulation structure according to another embodiment of the present disclosure.

In some embodiments, reference is made to FIG. 12, which is a top view of the light-emitting element encapsulation structure according to another embodiment of the present disclosure. The shading part 5 has a ring structure and is arranged around the light-emitting elements 2, to block and absorbing the light emitted by the light-emitting elements 2 in various directions. In an embodiment, the shape of the shading part 5 matches the shapes of the light-emitting elements 2. For example, in a case that the light-emitting elements 2 are rectangular, the shading part 5 correspondingly has a rectangular ring structure, to ensure the shading effect.

Figure 13:
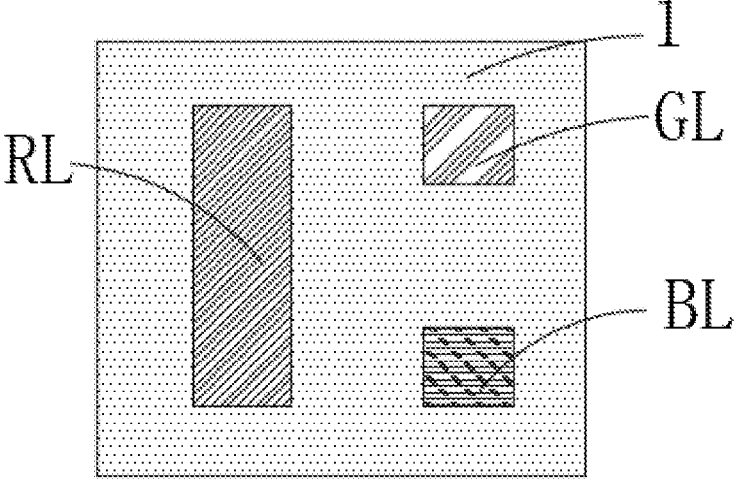
FIG. 13 is a top view of a light-emitting element encapsulation structure according to another embodiment of the present disclosure.

In addition to shading and absorbing the light emitted by the light-emitting elements 2 to sides by using the shading part 5 described above, the encapsulation layer 1 may be used to shade and absorb the light emitted by the light-emitting elements 2 to sides. As shown in FIG. 13, FIG. 13 is a top view of the light-emitting element encapsulation structure according to another embodiment of the present disclosure. The encapsulation layer 1 is made of a light-absorbing material, and the light-absorbing material may be materials with good light-absorption performance, such as a black colloid material or a resin material for preparing black matrices.

Figure 14:
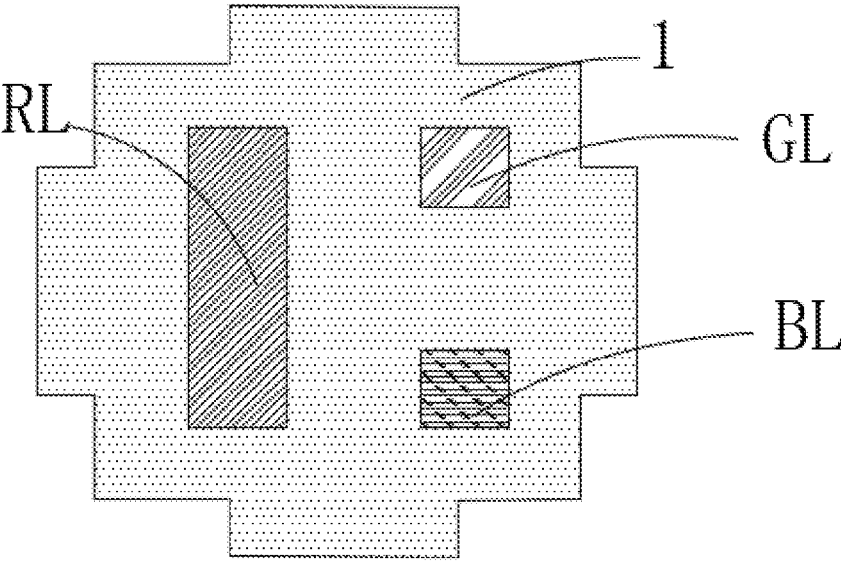
FIG. 14 is a top view of a light-emitting element encapsulation structure according to another embodiment of the present disclosure.

Referring to FIGS. 13 and 14, FIG. 14 is a top view of a light-emitting element encapsulation structure according to another embodiment of the present disclosure. In some embodiments, the shape of the light-emitting element encapsulation structure is polygonal. The shape of the light-emitting element encapsulation structure may be understood as an overall shape of the light-emitting element encapsulation structure when viewed from above. Since it is required to transfer the light-emitting element encapsulation structure to the array substrate 200, in order to facilitate picking up the light-emitting element encapsulation structure in the transfer process, as shown in FIG. 13, the shape of the light-emitting element encapsulation structure may be rectangular, which is convenient to adjust relative positions of the light-emitting element encapsulation structures after being transferred to the array substrate 200. In one embodiment, as shown in FIG. 14, the shape of the light-emitting element encapsulation structure may be a polygon with protrusions on four sides, for easy pick-up.

Figure 15:
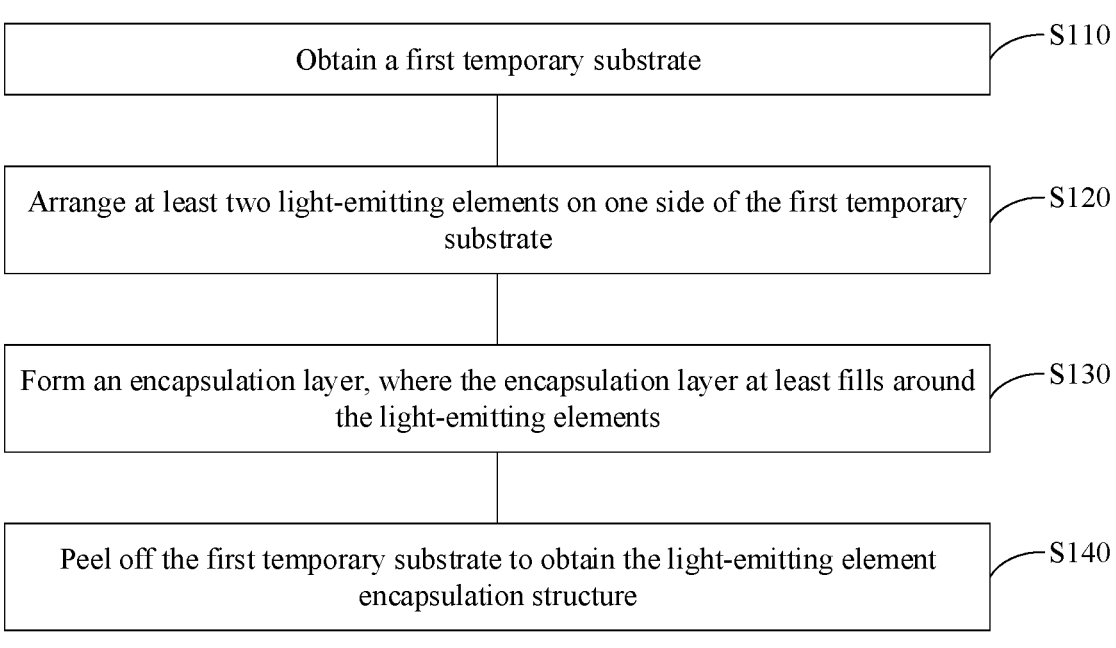
FIG. 15 is a flowchart of a method for manufacturing a light-emitting element encapsulation structure according to an embodiment of the present disclosure.

Referring to FIG. 15, a method for manufacturing a light-emitting element encapsulation structure is provided according to an embodiment of the present disclosure. The method includes the following steps S110 to S140.

Figure 16:
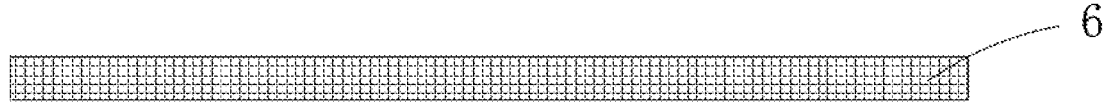
FIG. 16 is a cross-sectional view of a structure obtained in step S110 of a method for manufacturing a light-emitting element encapsulation structure according to an embodiment of the present disclosure.

In step S110, a first temporary substrate 6 is obtained, as shown in FIG. 16.

Figure 17:
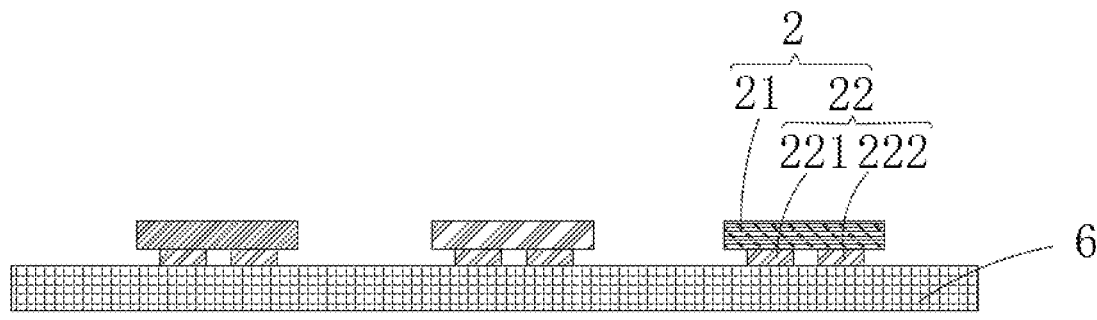
FIG. 17 is a cross-sectional view of a structure obtained in step S120 of a method for manufacturing a light-emitting element encapsulation structure according to an embodiment of the present disclosure.

In step S120, at least two light-emitting elements 2 are arranged on one side of the first temporary substrate 6, as shown in FIG. 17.

Figure 18:
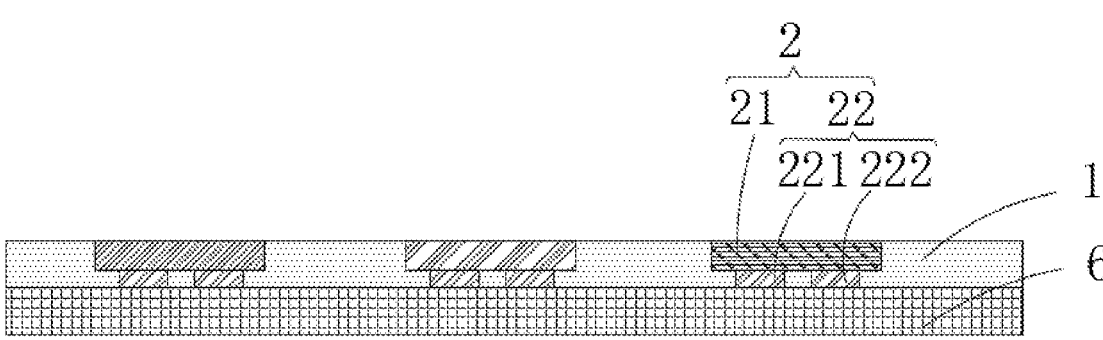
FIG. 18 is a cross-sectional view of a structure obtained in step S130 of a method for manufacturing a light-emitting element encapsulation structure according to an embodiment of the present disclosure.

In step S130, an encapsulation layer 1 is formed, where the encapsulation layer 1 at least fills around the light-emitting elements 2, as shown in FIG. 18.

Figure 19:
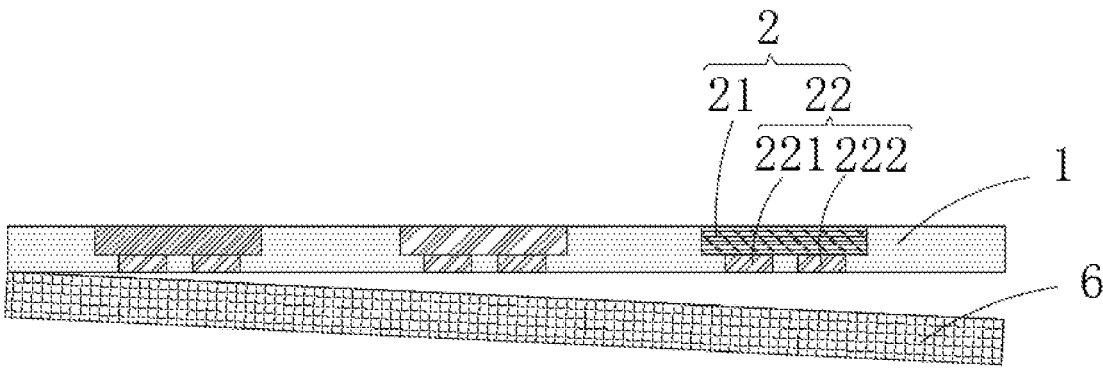
FIG. 19 is a cross-sectional view of a structure obtained in step S140 of a method for manufacturing a light-emitting element encapsulation structure according to an embodiment of the present disclosure.

In step S140, the first temporary substrate 6 is peeled off to obtain the light-emitting element encapsulation structure, as shown in FIG. 19.

With the method for manufacturing a light-emitting element encapsulation structure according to the embodiment of the present disclosure, at least two light-emitting elements 2 are encapsulated by the encapsulation layer 1 to form the light-emitting element encapsulation structure, and the light-emitting element encapsulation structure is transferred as a whole. Each light-emitting element encapsulation structure includes an encapsulation layer and at least two light-emitting elements. The overall size of the light-emitting element encapsulation structure is greater than a size of one light-emitting element. A greater size of the light-emitting element encapsulation structure indicates a lower requirement for accuracy of transfer equipment, effectively reducing the difficulty of transfer and improving the transfer efficiency. In addition, in the embodiments, each of the light-emitting elements in the light-emitting element encapsulation structure may be detected separately to determine whether the light-emitting element is damaged, facilitating the detection process and achieving accurate results. In a case of damage, a single damaged light-emitting element or the entire light-emitting element encapsulation structure may be repaired or replaced without affecting other light-emitting element encapsulation structures, to improve production yield and reducing production costs.

In step S110, the first temporary substrate 6 may be a glass substrate with low manufacturing cost.

In step S120, the light-emitting elements 2 may be transferred to one side of the first temporary substrate 6 by performing a laser transfer process, a stamp transfer process, or a mass transfer process, and then a testing process is performed to screen out light-emitting element 2 meeting requirements, improving the product yield.

In step S130, the encapsulation layer 1 may be formed by performing processes such as coating or inkjet printing. The encapsulation layer 1 may fills only around the light-emitting elements 2 or partially covers the upper surfaces of the light-emitting elements 2, which is not limited in the present disclosure.

In step S140, the first temporary substrate 6 may be peeled off by performing process such as laser peeling. For example, before arranging the at least two light-emitting elements 2 on one side of the first temporary substrate 6, the method includes: forming a sacrificial layer. The sacrificial layer is arranged on the first temporary substrate 6. The peeling off the first temporary substrate 6 includes: removing the sacrificial layer to peel off the first temporary substrate 6.

In performing the laser peeling process, the sacrificial layer may be decomposed or debonded under laser irradiation to separate the first temporary substrate 6 from the encapsulation layer 1 and the light-emitting elements 2 which are arranged on the first temporary substrate 6. The remaining encapsulation layer 1, the light-emitting elements 2 and other parts forms the light-emitting element encapsulation structure.

Figure 20:
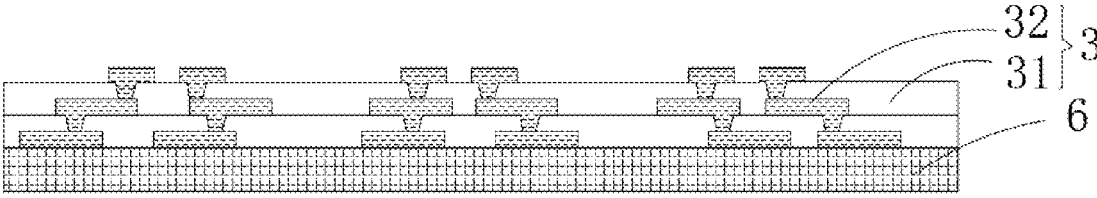
FIG. 20 is a cross-sectional view of a structure obtained in a step of a method for manufacturing a light-emitting element encapsulation structure according to an embodiment of the present disclosure.
Figure 21:
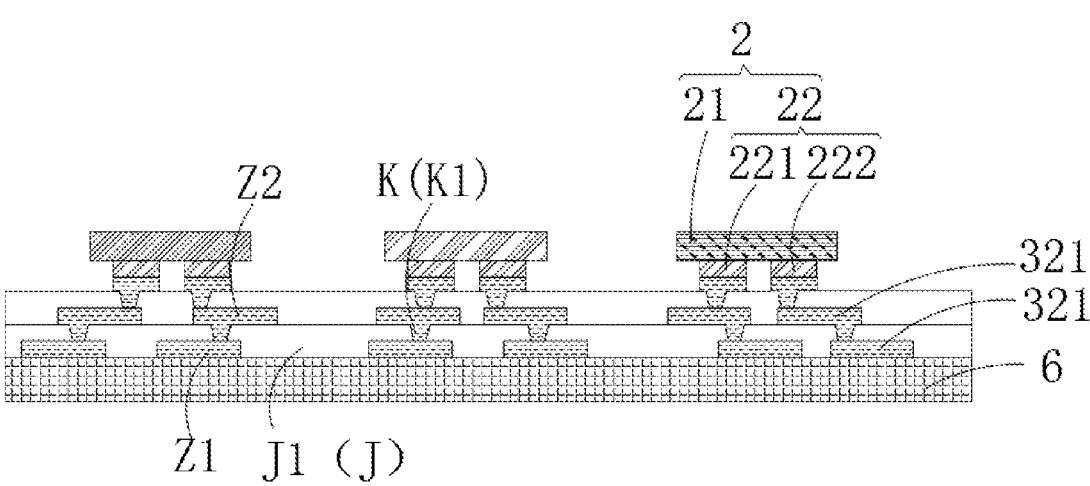
FIG. 21 is a cross-sectional view of a structure obtained in a step of a method for manufacturing a light-emitting element encapsulation structure according to an embodiment of the present disclosure.
Figure 22:
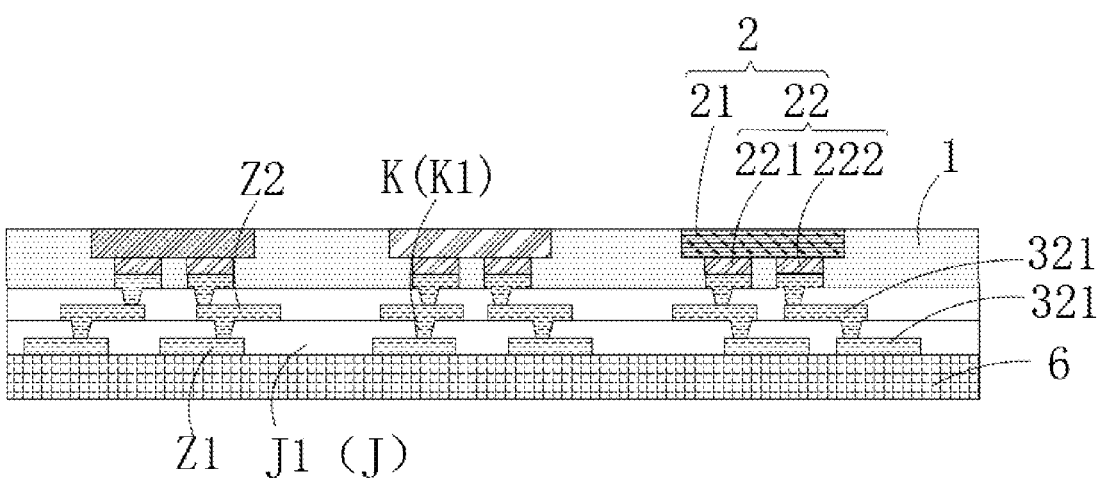
FIG. 22 is a cross-sectional view of a structure obtained in a step of a method for manufacturing a light-emitting element encapsulation structure according to an embodiment of the present disclosure.

Referring to FIGS. 20 to 22, FIG. 20 is a cross-sectional view of a structure obtained in a step of a method for manufacturing a light-emitting element encapsulation structure according to an embodiment of the present disclosure, FIG. 21 is a cross-sectional view of a structure obtained in a step of a method for manufacturing a light-emitting element encapsulation structure according to an embodiment of the present disclosure, and FIG. 22 is a cross-sectional view of a structure obtained in a step of a method for manufacturing a light-emitting element encapsulation structure according to an embodiment of the present disclosure. In some embodiments, before arranging the at least two light-emitting elements 2 on one side of the first temporary substrate 6, the method further includes: forming a rewiring layer 3, where the rewiring layer 3 includes an insulation structure 31 and an electrical connection part 32 as shown in FIG. 20. The arranging at least two light-emitting elements 2 on one side of the first temporary substrate 6 includes: arranging the at least two light-emitting elements 2 on the rewiring layer 3, and electrically connecting the light-emitting elements 2 to the electrical connection part 32, as shown in FIGS. 21 and 22.

In the embodiment, the rewiring layer 3 is arranged, the connection position of the light-emitting element encapsulation structure and the array substrate 200 may be adjusted by using the electrical connection part 32 of the rewiring layer 3, increasing the wiring space to facilitate the accurate connection between the light-emitting element encapsulation structure and the array substrate 200.

Figure 23:
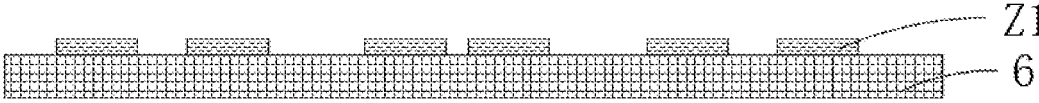
FIG. 23 is a cross-sectional view of a structure obtained in a step of a method for manufacturing a light-emitting element encapsulation structure according to an embodiment of the present disclosure.
Figure 24:
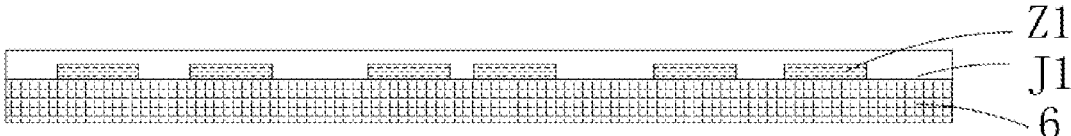
FIG. 24 is a cross-sectional view of a structure obtained in a step of a method for manufacturing a light-emitting element encapsulation structure according to an embodiment of the present disclosure.

Referring to FIGS. 23 and 24, FIG. 23 is a cross-sectional view of a structure obtained in a step of a method for manufacturing a light-emitting element encapsulation structure according to an embodiment of the present disclosure, and FIG. 24 is a cross-sectional view of a structure obtained in a step of a method for manufacturing a light-emitting element encapsulation structure according to an embodiment of the present disclosure. In an embodiment, the forming a rewiring layer 3 includes: forming a first sub electrical connection part Z1, as shown in FIG. 23; and forming a first insulation layer J1, where the first sub electrical connection part Z1 is embedded in the first insulation layer J1, as shown in FIG. 24. The peeling off the first temporary substrate 6 includes: exposing a surface of the first sub electrical connection part Z1 and a surface of the first insulation layer J1. The electrical connection part 32 includes the first sub electrical connection part Z1, and the insulation structure 31 includes the first insulation layer J1.

In the embodiment, the first sub electrical connection part Z1 may be formed by performing a photolithography process. Then, the first insulation layer J1 is formed around the first sub electrical connection part Z1 and on the upper surface of the first sub electrical connection part Z1 by performing a coating process. The exposing the surface of the first sub electrical connection part Z1 and the surface of the first insulation layer J1 indicates exposing a surface of the first sub electrical connection part Z1 away from the light-emitting elements 2 and a surface of the first insulation layer J1 from the light-emitting elements 2, and the first sub electrical connection part Z1 may be electrically connected to a binding part 41 subsequently formed. In the embodiment, since the first sub electrical connection part Z1 is formed firstly and then the first insulation layer J1 is formed, the first sub electrical connection part Z1 may be directly connected to the binding part 41 without a through hole K. Compared to the through hole K, the size of the first sub electrical connection part Z1 is larger, facilitating connecting to the binding part 41.

Figure 25:
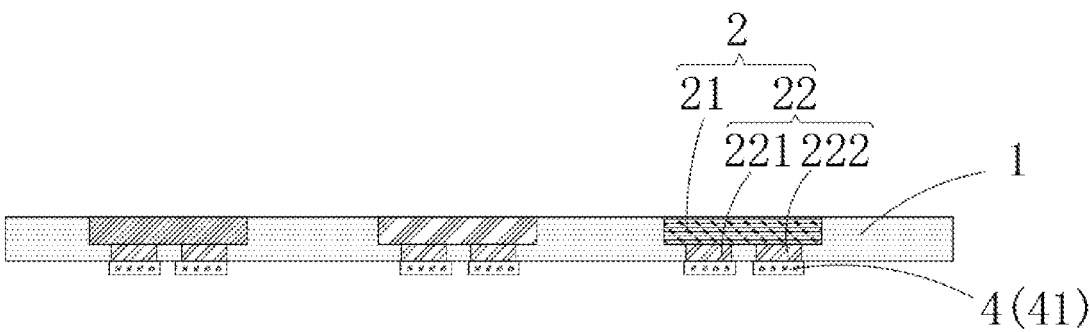
FIG. 25 is a cross-sectional view of a structure obtained in a step of a method for manufacturing a light-emitting element encapsulation structure according to an embodiment of the present disclosure.
Figure 26:
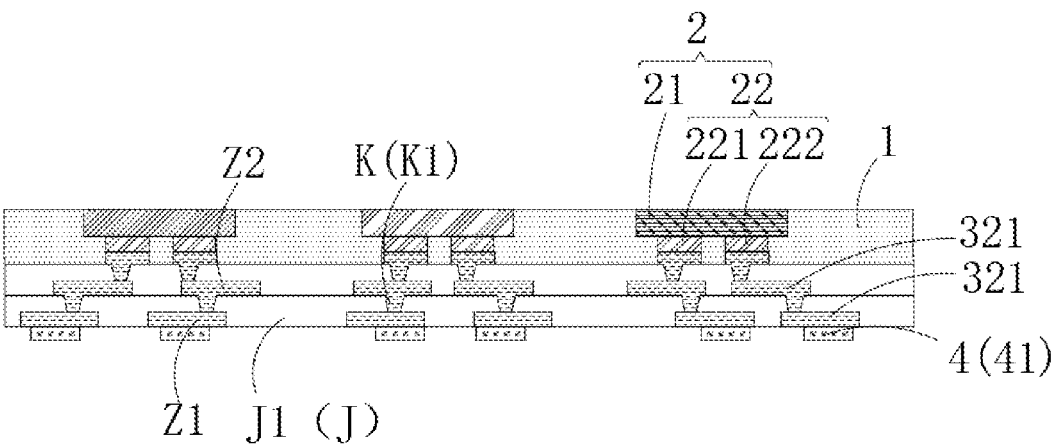
FIG. 26 is a cross-sectional view of a structure obtained in a step of a method for manufacturing a light-emitting element encapsulation structure according to an embodiment of the present disclosure.

The binding part 41 is formed as follows. After peeling off the first temporary substrate 6, the method further includes: forming a binding structure 4. The binding structure 4 is arranged on a side of the rewiring layer 3 away from the light-emitting elements 2. The binding structure 4 includes the binding part 41. The binding part 41 is electrically connected to the electrical connection part 32. As shown in FIGS. 25 and 26, FIG. 25 is a cross-sectional view of a structure obtained in a step of a method for manufacturing a light-emitting element encapsulation structure according to another embodiment of the present disclosure, and FIG. 26 is a cross-sectional view of a structure obtained in a step of a method for manufacturing a light-emitting element encapsulation structure according to another embodiment of the present disclosure.

In one embodiment, the binding part 41 may be directly connected to the first sub electrical connection part Z1. The material of the binding part 41 includes at least one of tin, silver, and copper. The binding part 41 may be made of solder balls formed by performing a planting ball process. Then, the light-emitting element encapsulation structure and the array substrate 200 bond and connected together with the solder balls. The material of the binding part 41 may be an anisotropic conductive film (ACF).

Referring to FIG. 27, a method for manufacturing a display panel is further provided according to an embodiment of the present disclosure. The method includes the following steps S210 and S220.

In step S210, light-emitting element encapsulation structures 100 and an array substrate 200 are obtained. For each of the light-emitting element encapsulation structures 100, the light-emitting element encapsulation structure 100 includes an encapsulation layer 1 and at least two light-emitting elements 2, and the light-emitting elements 2 are embedded in the encapsulation layer 1.

Figure 29:
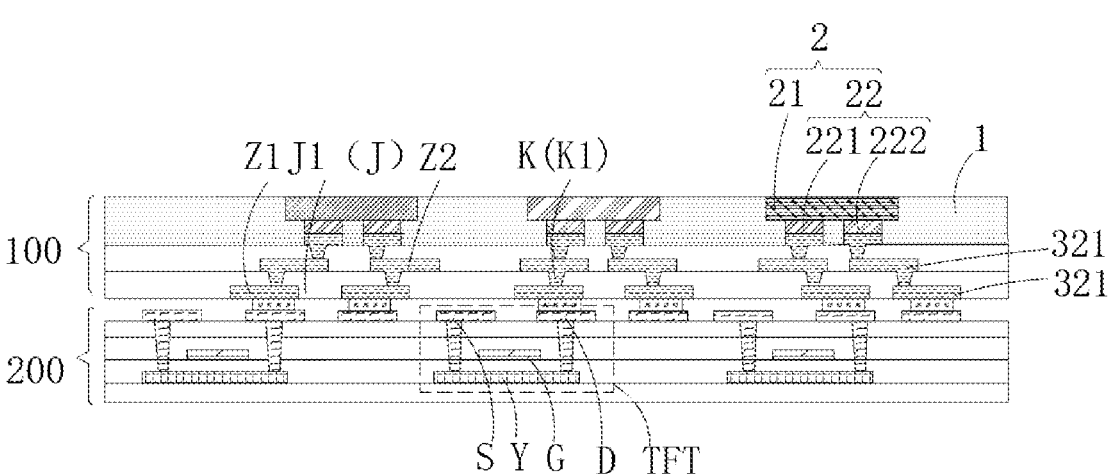
FIG. 29 is a cross-sectional view of a structure obtained in a step of a method for manufacturing a display panel according to an embodiment of the present disclosure.

In step S220: the light-emitting element encapsulation structures 100 are transferred to the array substrate 200, and the light-emitting elements 2 in each of the light-emitting element encapsulation structures 100 are electrically connected to the array substrate 200, as shown in FIGS. 28 and 29. FIG. 28 is a cross-sectional view of a structure obtained in a step of a method for manufacturing a display panel according to an embodiment of the present disclosure. FIG. 29 is a cross-sectional view of a structure obtained in a step of a method for manufacturing a display panel according to an embodiment of the present disclosure.

In step S220, each of the light-emitting element encapsulation structures may be separately transferred to the array substrate 200, and the light-emitting elements 2 are electrically connected to the array substrate 200. That is, the light-emitting element encapsulation structures are transferred to the array substrate 200 one by one, achieving high transfer accuracy.

Figure 30:
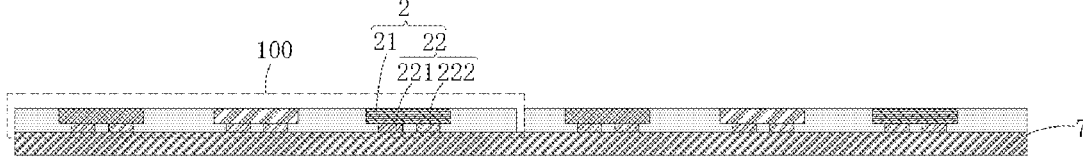
FIG. 30 is a cross-sectional view of a structure obtained in a step of a method for manufacturing a display panel according to an embodiment of the present disclosure.

Reference is made to FIG. 30, which is a cross-sectional view of a structure obtained in a step of a method for manufacturing a display panel according to an embodiment of the present disclosure. In order to improve transfer efficiency, at least two light-emitting element encapsulation structures may be transferred to a second temporary substrate 7, and the light-emitting element encapsulation structures on the second temporary substrate 7 are transferred to the array substrate 200, then the light-emitting elements 2 are electrically connected to the array substrate 200. In the embodiment, multiple light-emitting element encapsulation structures on the second temporary substrate 7 may be transferred together to the array substrate 200, achieving high transfer efficiency.

In order to drive the light-emitting elements 2, in an embodiment, as shown in FIG. 28 or FIG. 29, the array substrate 200 includes multiple pixel circuits. Each of the pixel circuits includes a thin film transistor TFT. The thin film transistor TFT includes an active layer Y, a gate G, a source S, and a drain D. Each of light-emitting elements 2 is electrically connected to one of the source S and the drain D.

The materials of the source S and the gate G may include one of or a combination of molybdenum, titanium, aluminum, copper, and the like. The gate G of the thin film transistor TFT is usually configured to receive a control signal, and the thin film transistor TFT is controlled to be conducted or cut off under the control of the control signal.

Figure 31:
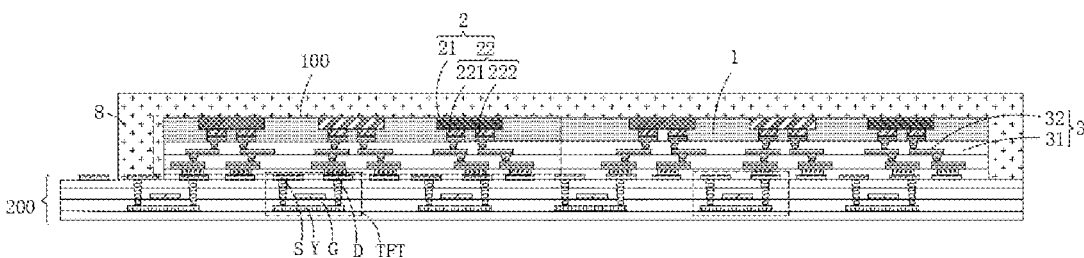
FIG. 31 is a schematic structural diagram showing film layers of a display panel according to an embodiment of the present disclosure.
Figure 32:
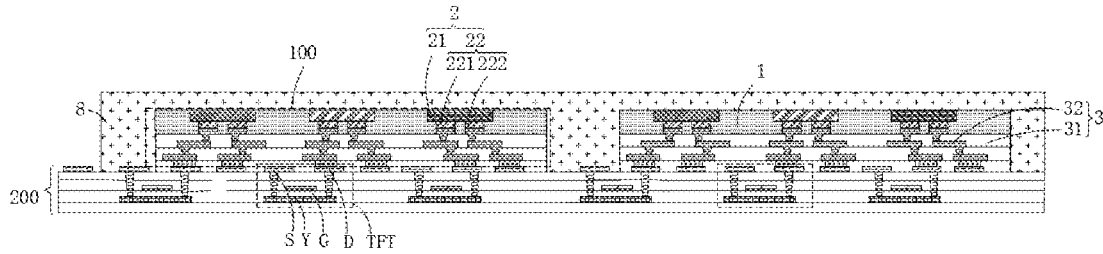
FIG. 32 is a schematic structural diagram showing film layers of a display panel according to another embodiment of the present disclosure.

In an embodiment, the method for manufacturing a display panel further includes: forming an outer encapsulation layer 8. The outer encapsulation layer 8 covers the light-emitting element encapsulation structures 100. The outer encapsulation layer 8 may be formed by performing processes such as coating. The outer encapsulation layer 8 may be made of an organic material such as epoxy resin for filling, as shown in FIG. 31 or FIG. 32. FIG. 31 is a schematic structural diagram showing film layers of a display panel according to an embodiment of the present disclosure. FIG. 32 is a schematic structural diagram showing film layers of a display panel according to another embodiment of the present disclosure.

Figure 33:
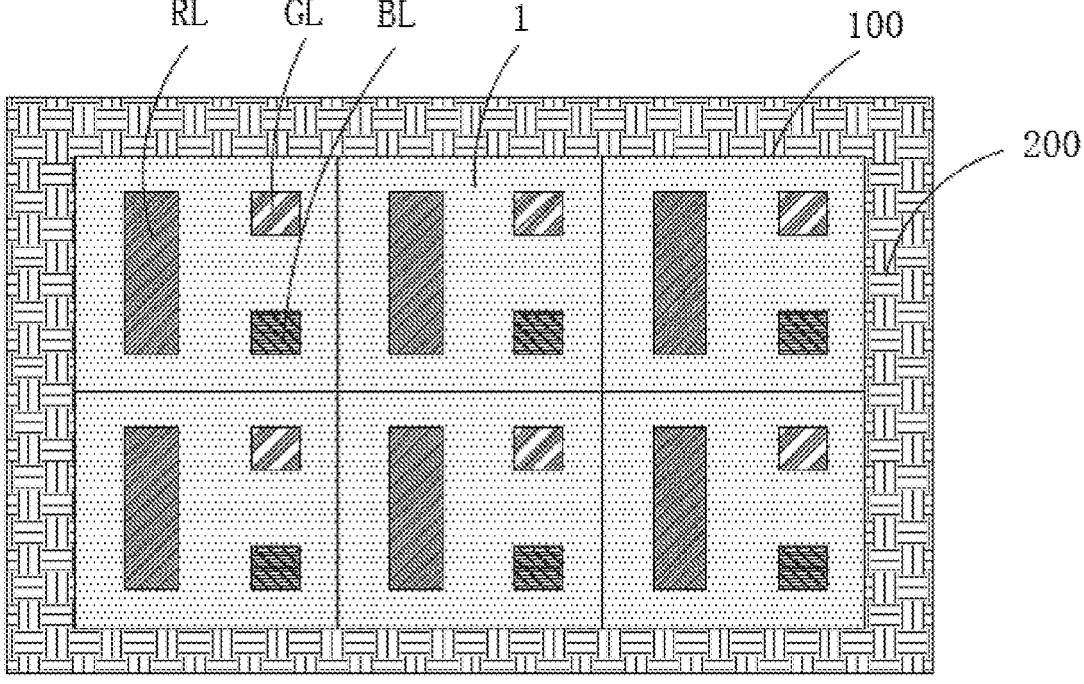
FIG. 33 is a top view of a display panel according to an embodiment of the present disclosure.

Referring to FIGS. 31 to 33, FIG. 33 is a top view of a display panel according to an embodiment of the present disclosure. A display panel is further provided according to an embodiment of the present disclosure. The display panel includes: the light-emitting element encapsulation structures 100 described in the above embodiments, and an array substrate 200. The light-emitting elements 2 in the light-emitting element encapsulation structures 100 are electrically connected to the array substrate 200.

The display panel may include multiple light-emitting element encapsulation structures 100. The number of the light-emitting element encapsulation structures 100 may be determined according to actual requirements and is not limited in the present disclosure.

In an embodiment, as shown in FIG. 31, the display panel includes at least two light-emitting element encapsulation structures 100, and adjacent light-emitting element encapsulation structures 100 are connected to each other. That is, there is no gap between adjacent light-emitting element encapsulation structures 100. In one embodiment, the encapsulation layers 1 of the adjacent two light-emitting element encapsulation structures 100 may directly contact with each other, improving the space utilization of the array substrate 200 and facilitating arranging more light-emitting element encapsulation structures 100.

Apparently, as shown in FIG. 32, two adjacent light-emitting element encapsulation structures 100 may be arranged with a space interval. That is, there is a space interval between two adjacent light-emitting element encapsulation structures 100, avoiding collision between adjacent light-emitting element encapsulation structures 100 in transferring a light-emitting element encapsulation structure 100 to the array substrate 200.

As shown in FIG. 33, in some embodiments, the display panel includes at least two light-emitting element encapsulation structures 100, and a shape of an outer edge of a light-emitting element encapsulation structure 100 matches a shape of a corresponding outer edge of an adjacent light-emitting element encapsulation structure 100. For example, in a case that one light-emitting element encapsulation structure 100 is in a parallelogram-shape, an adjacent light-emitting element encapsulation structure 100 may be in a same parallelogram-shape, and edges, having corresponding lengths and tilt angles, of the two adjacent light-emitting element encapsulation structure 100 may be arranged adjacent to each other. In one embodiment, in a case that a light-emitting element encapsulation structure 100 has at least one curved outer edge with a curvature, an adjacent light-emitting element encapsulation structure 100 has a curved outer edge with the same curvature, and the two curved outer edges are arranged adjacent to each other. Thus, the space utilization of the array substrate 200 is improved, and space waste between adjacent light-emitting element encapsulation structures 100 is avoided.

As shown in FIGS. 31 and 32, in some embodiments, the display panel further includes an outer encapsulation layer 8. The outer encapsulation layer 8 covers the light-emitting element encapsulation structures 100.

The outer encapsulation layer 8 may be made of organic materials such as epoxy resin for filling.

A display device is further provided according to an embodiment of the present disclosure. The display device includes the display panel described in the above embodiments.

Figure 34:
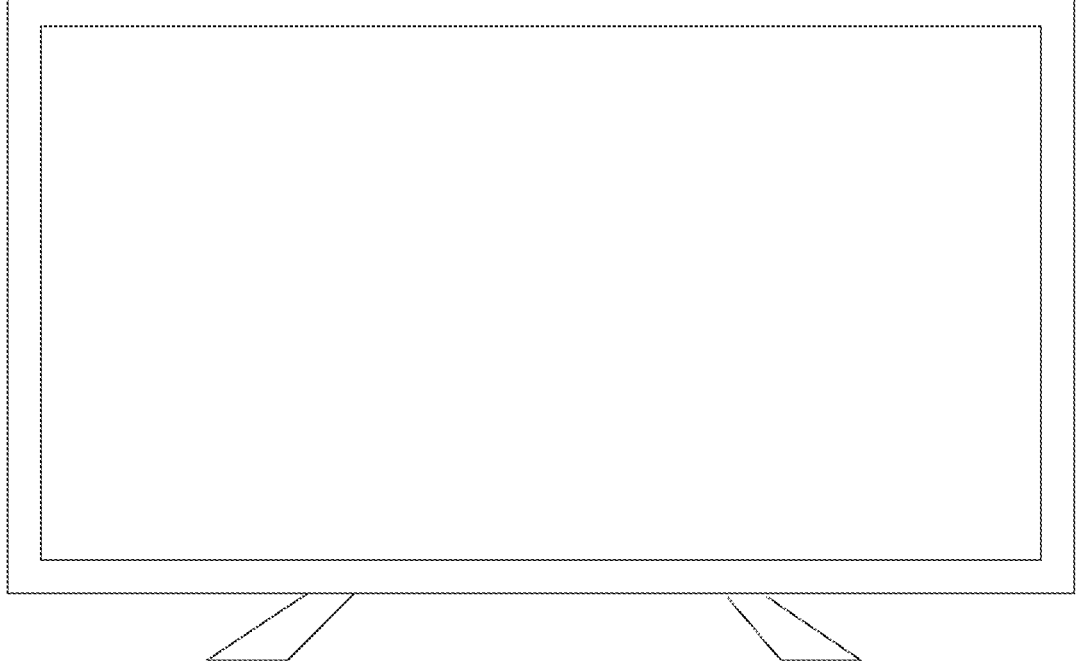
FIG. 34 is a schematic diagram of a display device according to an embodiment of the present disclosure.

Therefore, the display device according to the embodiment of the present disclosure has the effects of the display panel according to the above embodiments, and descriptions of the same as or corresponding structures and terms are not repeated herein. The display device according to the embodiments of the present disclosure may be a mobile phone or any electronic product with a display functions, including but not limited to: televisions, laptops, desktop displays, tablets, digital cameras, smart bracelets, smart glasses, vehicle displays, medical equipment, industrial control equipment, touch interaction terminals, and the like, which are not limited in the embodiments of the present disclosure. FIG. 34 is a schematic diagram of a display device according to an embodiment of the present disclosure, and shows a television as an example.

The above embodiments only describe specific implementations of the present disclosure and for the convenience and conciseness of the description, specific operation processes of systems, modules, and units described above may refer to the processes in the aforementioned method embodiments, and are not repeated herein. It should be understood that the protection scope of the present disclosure is not limited to this. Various equivalent modifications or replacements within the embodiment of the present disclosure, and the modifications or replacements should be included in the protection scope of the present disclosure.

It should be further noted that the exemplary embodiments in the present disclosure describe some methods or systems based on a series of steps or devices. However, the present disclosure is not limited to the order of the above steps. That is, the steps may be performed in the order mentioned in the embodiments, or in an order different from the order mentioned in the embodiments, or multiple steps may be performed simultaneously.

What is claimed is:

1. A light-emitting element encapsulation structure, comprising: an encapsulation layer and at least two light-emitting elements, wherein the light-emitting elements are embedded in the encapsulation layer;

wherein the light-emitting element encapsulation structure comprises: a rewiring layer, the rewiring layer comprises an insulation structure and an electrical connection part, the electrical connection part comprises first electrical connection parts and a second electrical connection part, and the first electrical connection parts and the second electrical connection part are arranged on a same layer;

the light-emitting element encapsulation structure comprises at least one light-emitting element group, the light-emitting element group comprises a red light-emitting element, a green light-emitting element, and a blue light-emitting element; and a cross-section of the second electrical connection part is an inverted h-shaped in a first direction, a top of the "h" is connected to a second electrode of the red light-emitting element, and bottoms of the "h" are respectively connected to a second electrode of the green light-emitting element and a second electrode of the blue light-emitting element.

2. The light-emitting element encapsulation structure according to claim 1, wherein each of the light-emitting elements comprises a main body and electrodes, and the electrodes are exposed from the encapsulation layer;

the electrodes comprise a first electrode and a second electrode, the first electrode and the second electrode are located at a same side of the main body, and the first electrode and the second electrode are exposed from the encapsulation layer; and the electrodes form an electrical connection structure of the light-emitting element encapsulation structure.

3. The light-emitting element encapsulation structure according to claim 1, wherein the light-emitting elements are arranged on the rewiring layer, and are electrically connected to the electrical connection part.

4. The light-emitting element encapsulation structure according to claim 3, wherein the insulation structure comprises at least two insulation layers;

the electrical connection part comprises at least two sub electrical connection parts;

the sub electrical connection parts arranged on opposite sides of an insulation layer are electrically connected via through a hole of the insulation layer; and a material of the insulation layer comprises an organic material.

5. The light-emitting element encapsulation structure according to claim 3, wherein the insulation structure comprises at least two insulation layers, the electrical connection part comprises at least two sub electrical connection parts, and the sub electrical connection parts arranged on opposite sides of an insulation layer are electrically connected via a through hole of the insulation layer;

the rewiring layer comprises a first surface and a second surface which are opposite to each other, the second surface is arranged between the first surface and the light-emitting elements, the insulation layers of the insulation structure comprises a first insulation layer, the first surface of the rewiring layer comprises a surface of the first insulation layer, the sub electrical connection parts of the electrical connection part comprise a first sub electrical connection part, and the first surface of the rewiring layer further comprises a surface of the first sub electrical connection part;

the first sub electrical connection part is embedded in the first insulation layer; and the sub electrical connection part, arranged on the first insulation layer and facing the light-emitting elements, is a second sub electrical connection part, the second sub electrical connection part is connected to the first sub electrical connection part via a first through hole of the first insulation layer, and a size of the first through hole is less than a size of the first sub electrical connection part.

6. The light-emitting element encapsulation structure according to claim 3, further comprising: a binding structure; wherein the binding structure is arranged on a side of the rewiring layer away from the light-emitting elements;

the binding structure comprises a binding part, and the binding part is electrically connected to the electrical connection part; and the binding part at least partially does not overlap the light-emitting elements.

7. The light-emitting element encapsulation structure according to claim 1, wherein the light-emitting elements are arranged on the rewiring layer; and for each of the light-emitting elements, a first electrode of the light-emitting element is connected to a different first electrical connection part, and a second electrode of the light-emitting element is connected to the same second electrical connection part.

8. The light-emitting element encapsulation structure according to claim 1, wherein in the light-emitting element group, in a first direction, the red light-emitting element and the green light-emitting element are arranged with a space interval and the red light-emitting element and the blue light-emitting element are arranged with a space interval; and in a second direction, the green light-emitting element and the blue light-emitting element are arranged with a space interval; wherein the first direction intersects with the second direction;

a first electrical connection part connected to the red light-emitting element is at least partially arranged on a side of the red light-emitting element away from the green light-emitting element, a first electrical connection part connected to the green light-emitting element is at least partially arranged on a side of the green light-emitting element away from the red light-emitting element, and a first electrical connection part connected to the blue light-emitting element is at least partially arranged on a side of the blue light-emitting element away from the red light-emitting element;

the second electrical connection part is at least partially arranged in the space interval between the red light-emitting element and the green light-emitting element and in the space interval between the red light-emitting element and the blue light-emitting element.

9. The light-emitting element encapsulation structure according to claim 1, wherein the encapsulation layer is arranged around the light-emitting elements; and in a direction perpendicular to a plane where the encapsulation layer is located, an upper surface of the encapsulation layer is lower than or flush with upper surfaces of the light-emitting elements.

10. The light-emitting element encapsulation structure according to claim 1, further comprising a shading part, wherein the shading part is at least arranged between adjacent light-emitting elements.

11. A method for manufacturing a light-emitting element encapsulation structure, comprising:

obtaining a first temporary substrate;

arranging at least two light-emitting elements on one side of the first temporary substrate;

forming an encapsulation layer, wherein the encapsulation layer at least fills around the light-emitting elements; and peeling off the first temporary substrate to obtain the light-emitting element encapsulation structure;

wherein before arranging the at least two light-emitting elements on one side of the first temporary substrate, the method further comprises: forming a rewiring layer, wherein the rewiring layer comprises an insulation structure and an electrical connection part, the electrical connection part comprises first electrical connection parts and a second electrical connection part, and the first electrical connection parts and the second electrical connection part are arranged on a same layer;

the light-emitting element encapsulation structure comprises at least one light-emitting element group, the light-emitting element group comprises a red light-emitting element, a green light-emitting element, and a blue light-emitting element; and a cross-section of the second electrical connection part is an inverted h-shaped in a first direction, a top of the "h" is connected to a second electrode of the red light-emitting element, and bottoms of the "h" are respectively connected to a second electrode of the green light-emitting element and a second electrode of the blue light-emitting element.

12. The method for manufacturing a light-emitting element encapsulation structure according to claim 11, wherein before arranging the at least two light-emitting elements on one side of the first temporary substrate, the method further comprises:

forming a sacrificial layer, wherein the sacrificial layer is arranged on the first temporary substrate;

wherein the peeling off the first temporary substrate comprises: removing the sacrificial layer to peel off the first temporary substrate.

13. The method for manufacturing a light-emitting element encapsulation structure according to claim 11, wherein the arranging at least two light-emitting elements on one side of the first temporary substrate comprises:

arranging the at least two light-emitting elements on the rewiring layer, and electrically connecting the light-emitting elements to the electrical connection part; and after peeling off the first temporary substrate, the method further comprises:

forming a binding structure, wherein the binding structure is arranged on a side of the rewiring layer away from the light-emitting elements, the binding structure comprises a binding part, and the binding part is electrically connected to the electrical connection part.

14. The method for manufacturing a light-emitting element encapsulation structure according to claim 13, wherein the forming a rewiring layer comprises:

forming a first sub electrical connection part; and forming a first insulation layer, wherein the first sub electrical connection part is embedded in the first insulation layer;

wherein the peeling off the first temporary substrate comprises: exposing a surface of the first sub electrical connection part and a surface of the first insulation layer; and the electrical connection part comprises the first sub electrical connection part, and the insulation structure comprises the first insulation layer.

15. A method for manufacturing a display panel, comprising:

obtaining the light-emitting element encapsulation structures according to claim 1 and an array substrate; and transferring the light-emitting element encapsulation structures to the array substrate to electrically connect the light-emitting elements in each of the light-emitting element encapsulation structures to the array substrate.

16. The method for manufacturing a display panel according to claim 15, wherein the transferring the light-emitting element encapsulation structures to the array substrate to electrically connect the light-emitting elements in each of the light-emitting element encapsulation structures to the array substrate comprises:

transferring at least two light-emitting element encapsulation structures to a second temporary substrate, transferring the light-emitting element encapsulation structures on the second temporary substrate to the array substrate together, to electrically connect the light-emitting elements in two light-emitting element encapsulation structure to the array substrate.

17. The method for manufacturing a display panel according to claim 15, further comprising:

forming an outer encapsulation layer, wherein the outer encapsulation layer covers the light-emitting element encapsulation structures.

18. A display panel, comprising:

the light-emitting element encapsulation structures according to claim 1;

an array substrate, wherein the light-emitting elements in the light-emitting element encapsulation structures are electrically connected to the array substrate; and at least two light-emitting element encapsulation structures, wherein adjacent light-emitting element encapsulation structures are connected to each other or adjacent light-emitting element encapsulation structures are arranged with a space interval.

19. The display panel according to claim 18, further comprising:

an outer encapsulation layer, wherein the outer encapsulation layer covers the light-emitting element encapsulation structures.

20. A display device, comprising the display panel according to claim 18.

* * * * *